United States Patent
Liaw

(10) Patent No.: US 10,163,904 B1
(45) Date of Patent: Dec. 25, 2018

(54) SEMICONDUCTOR DEVICE STRUCTURE

(71) Applicant: Taiwan Semiconductor Manufacturing Co., Ltd., Hsinchu (TW)

(72) Inventor: Jhon-Jhy Liaw, Zhudong Township, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/692,245

(22) Filed: Aug. 31, 2017

(51) Int. Cl.
| H01L 27/092 | (2006.01) |
| H01L 29/66 | (2006.01) |
| H01L 29/78 | (2006.01) |
| H01L 29/08 | (2006.01) |
| H01L 21/8238 | (2006.01) |

(52) U.S. Cl.
CPC .. H01L 27/0924 (2013.01); H01L 21/823821 (2013.01); H01L 29/0847 (2013.01); H01L 29/66545 (2013.01); H01L 29/7843 (2013.01)

(58) Field of Classification Search
None
See application file for complete search history.

(56) References Cited

U.S. PATENT DOCUMENTS

| 8,765,546 B1 * | 7/2014 | Hung | H01L 21/823431 257/190 |
| 8,836,016 B2 * | 9/2014 | Wu | H01L 29/66795 257/329 |
| 8,841,701 B2 | 9/2014 | Lin et al. | |
| 8,847,293 B2 | 9/2014 | Lee et al. | |
| 8,853,025 B2 | 10/2014 | Zhang et al. | |
| 8,962,400 B2 | 2/2015 | Tsai et al. | |
| 9,093,514 B2 | 7/2015 | Tsai et al. | |
| 9,236,267 B2 | 1/2016 | De et al. | |
| 9,245,805 B2 | 1/2016 | Yeh et al. | |
| 9,520,482 B1 | 12/2016 | Chang et al. | |
| 9,576,814 B2 * | 2/2017 | Wu | H01L 21/308 |
| 9,613,953 B2 | 4/2017 | Liaw | |
| 2013/0140639 A1 * | 6/2013 | Shieh | H01L 21/823412 257/368 |
| 2013/0292777 A1 * | 11/2013 | Liaw | G11C 11/412 257/369 |

(Continued)

*Primary Examiner* — Bilkis Jahan
(74) *Attorney, Agent, or Firm* — McClure, Qualey & Rodack, LLP

(57) ABSTRACT

A semiconductor device structure is provided. The semiconductor device structure includes a first circuit, a second circuit, and a dielectric dummy gate over a substrate. The first circuit includes a first N-type fin field-effect transistor (FinFET) and a first P-type fin field-effect transistor (FinFET). The second circuit includes a second N-type fin field-effect transistor (FinFET) and a second P-type fin field-effect transistor (FinFET) beside the second N-type FinFET. The dielectric dummy gate is positioned on a common boundary portion shared by the first circuit and the second circuit. The dielectric dummy gate includes a first portion and a second portion. The first portion is positioned between the first N-type FinFET and the second N-type FinFET and formed of a first strain material. The second portion is positioned between the first P-type FinFET and the second P-type FinFET and formed of a second strain material.

16 Claims, 18 Drawing Sheets

(56) References Cited

U.S. PATENT DOCUMENTS

2014/0327080 A1* 11/2014 Hung ................ H01L 29/66515
                                                    257/365
2015/0014780 A1* 1/2015 Kim .................... H01L 27/0924
                                                    257/369

* cited by examiner

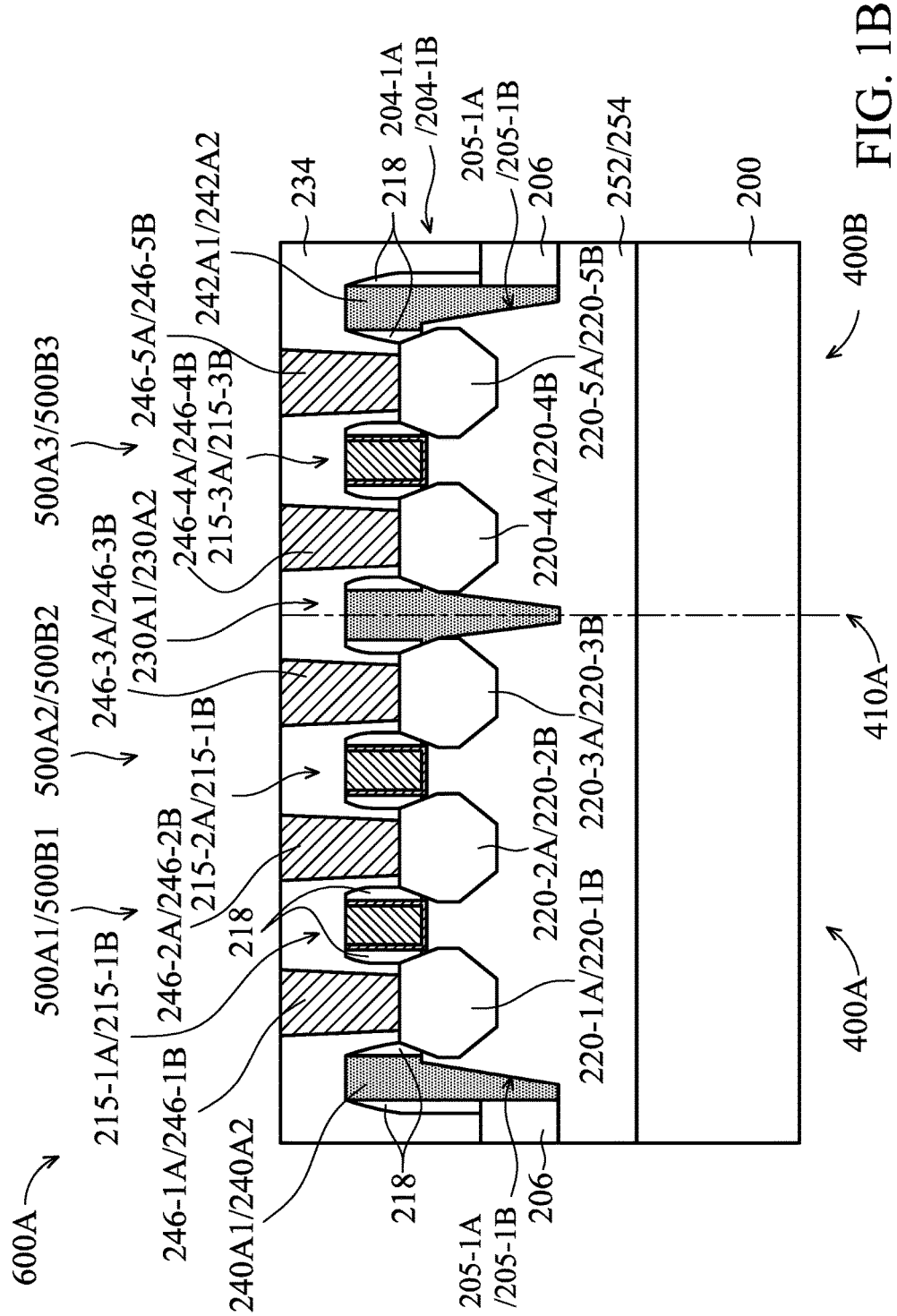

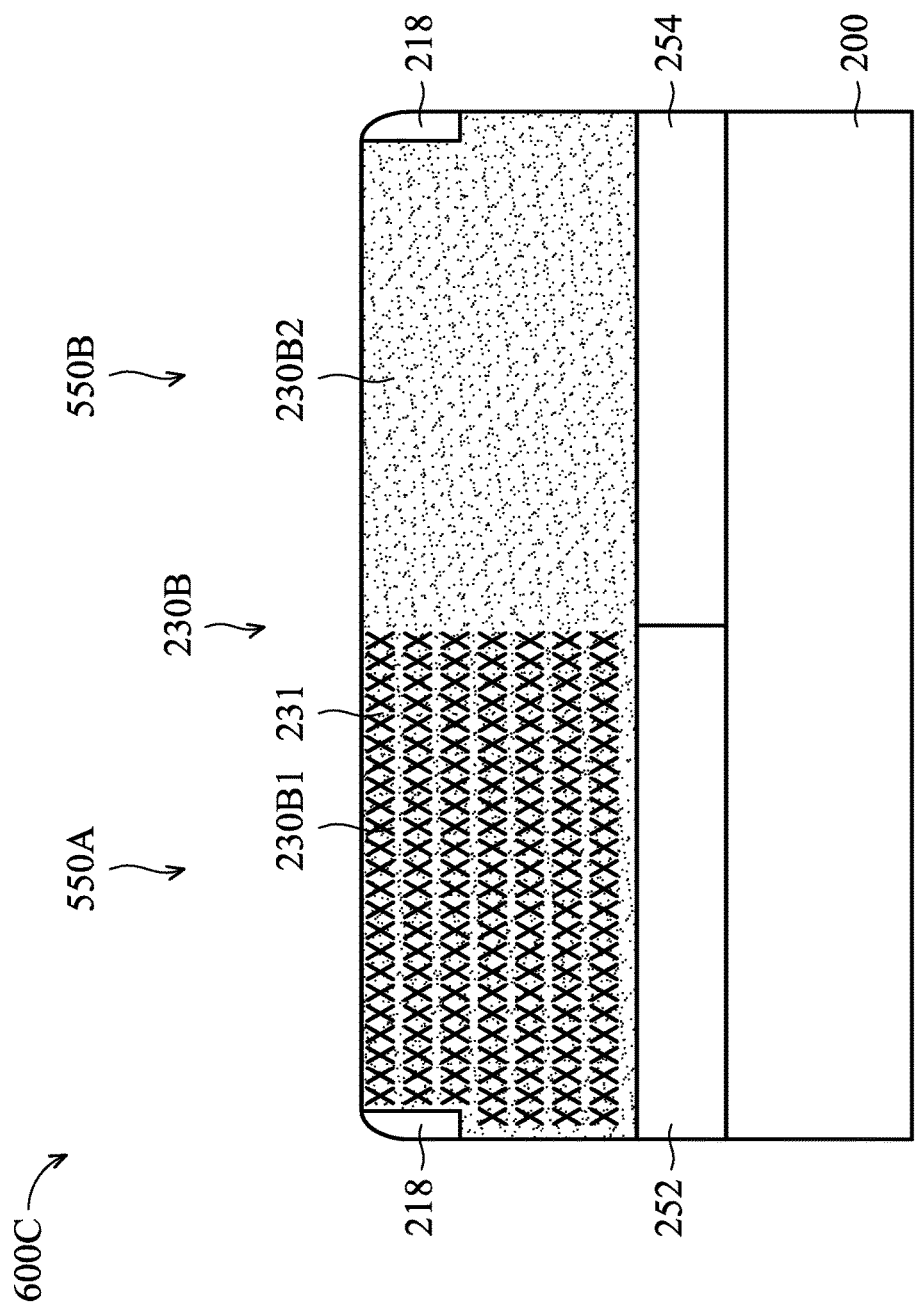

SEMICONDUCTOR DEVICE STRUCTURE

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of IC evolution, functional density (i.e., the number of interconnected devices per chip area) has generally increased while geometric size (i.e., the smallest component that can be created using a fabrication process) has decreased.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIG. 1B illustrates a cross-sectional view taken along line A-A' or line B-B' of FIG. 1A, showing cross-sectional views of a semiconductor device structure in accordance with embodiments;

FIG. 3C illustrates a cross-sectional view taken along line C-C' of FIG. 3A, showing cross-sectional views of a semiconductor device structure in accordance with embodiments;

DETAILED DESCRIPTION

Figure 1A:
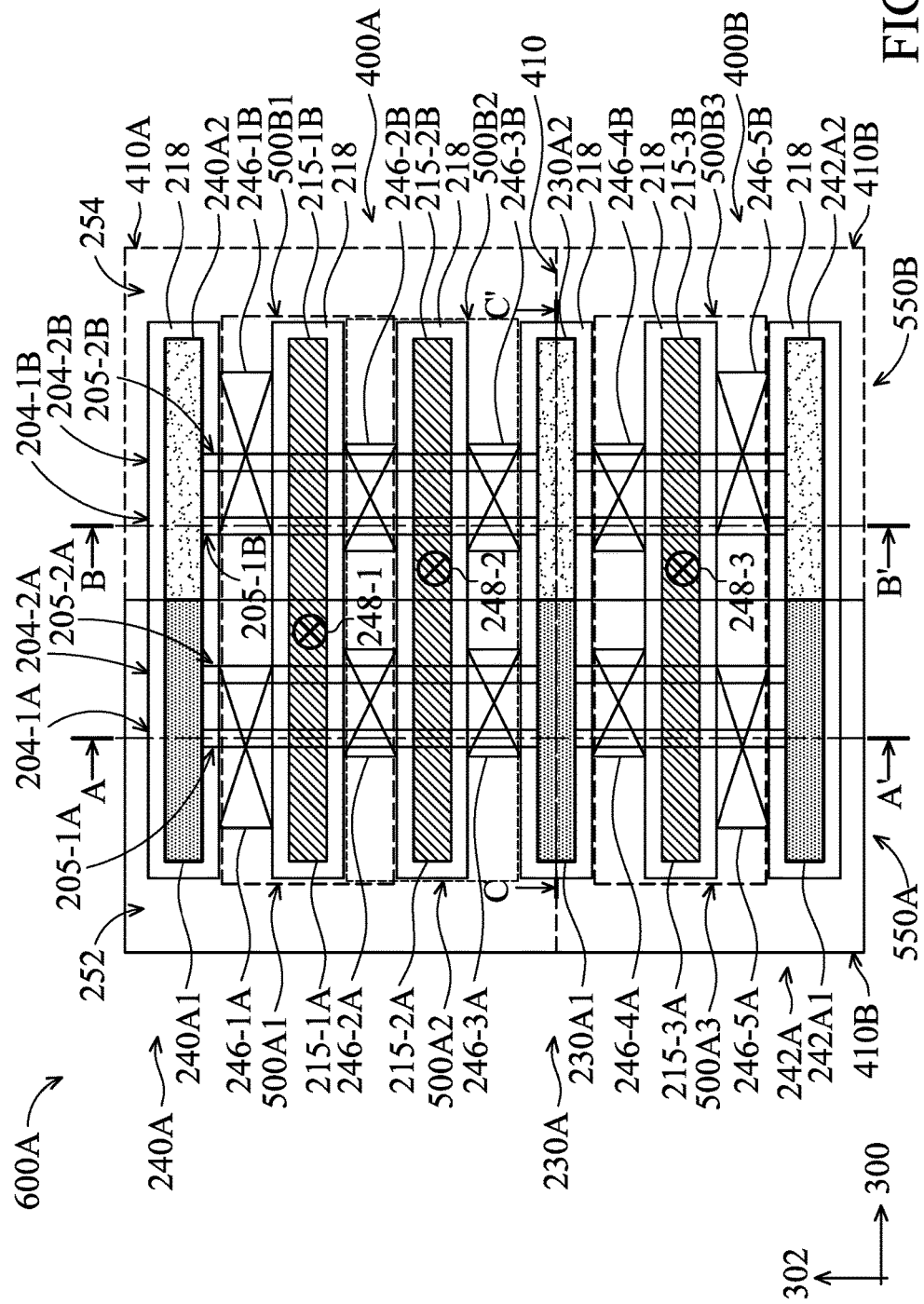
FIG. 1A illustrates a top view of a layout of a semiconductor device structure in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows includes embodiments in which the first and second features are formed in direct contact, and may also include embodiments in which additional features may be formed between the first and second features, such that the first and second features may not be in direct contact. The present disclosure may repeat reference numerals and/or letters in some various examples. This repetition is for the purpose of simplicity and clarity and does not in itself dictate a relationship between some various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process.

For example, in one embodiment, a sacrificial layer is formed over a substrate and patterned using a photolithography process. Spacers are formed alongside the patterned sacrificial layer using a self-alignment process. The sacrificial layer is then removed, and the remaining spacers may then be used to pattern the fins.

Figure 1C:
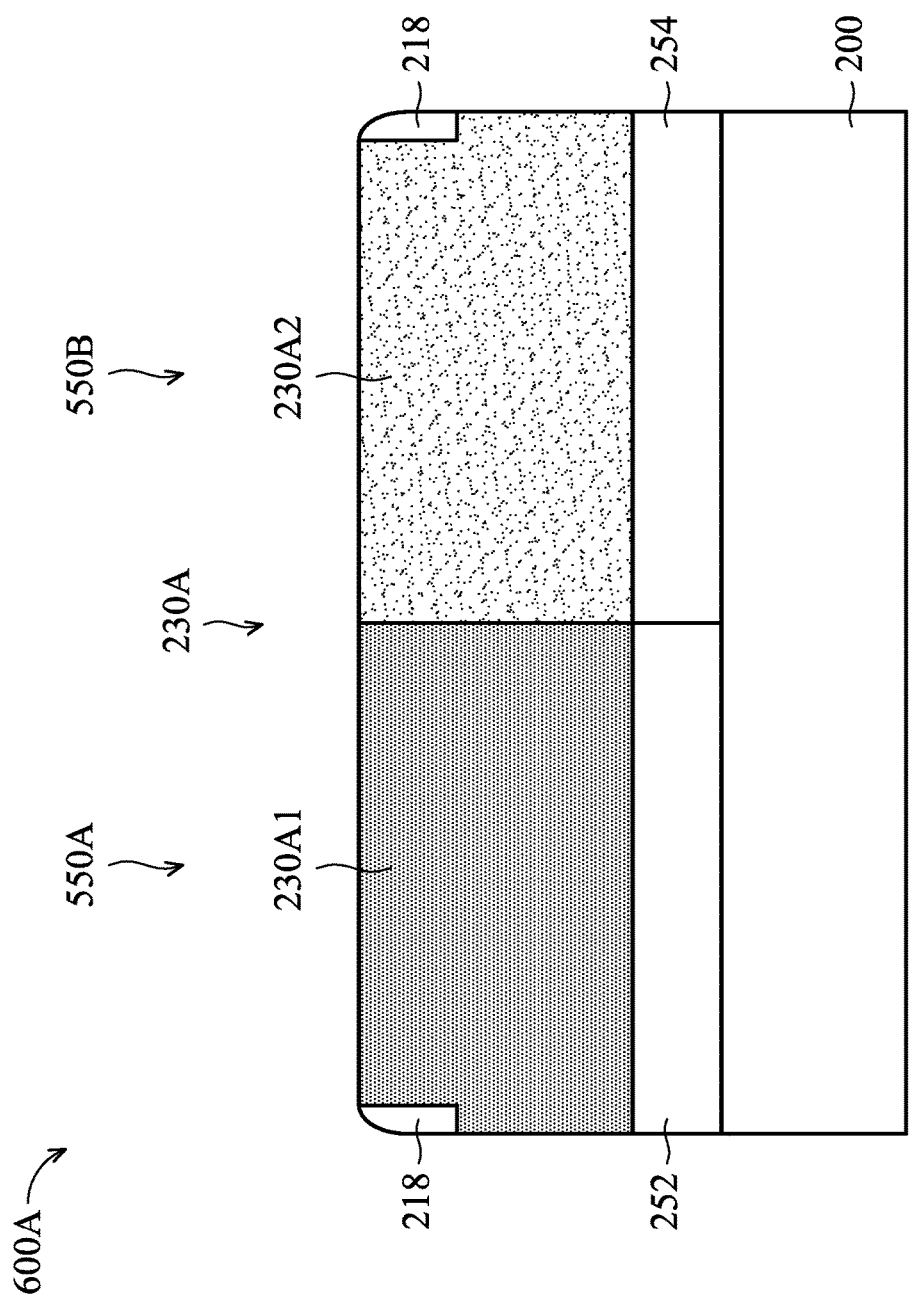
FIG. 1C illustrates a cross-sectional view taken along line C-C' of FIG. 1A, showing cross-sectional views of a semiconductor device structure in accordance with embodiments.

FIG. 1A illustrates a top view of a layout of a semiconductor device structure 600A in accordance with some embodiments. FIG. 1A is also used to illustrate a plan view of the semiconductor device structure 600A, especially showing the arrangement of fins (active regions), gate electrodes, gate contacts and source/drain contacts of FinFETs and dielectric dummy gates. It should be noted that some features, for example, the isolating features, the source/drain features and the dielectric layer (e.g. the inter-layer dielectric (ILD) layer) are not shown for clarity. FIG. 1B illustrates a cross-sectional view taken along line A-A' or line B-B' of FIG. 1A. FIG. 1C illustrates a cross-sectional view taken along line C-C' of FIG. 1A.

As shown in FIG. 1A, the semiconductor device structure 600A includes a first circuit 400A, a second circuit 400B, a first device region 550A, a second device region 550B, semiconductor fins 204-1A, 204-1B, 204-2A, 204-2B, metal gate electrode structures 215-1A, 215-2A, 215-3A, 215-1B, 215-2B and 215-3B, dummy gates 230A, 240A and 242A, gate contacts 248-1, 248-2 and 248-3 and source/drain contacts 246-1A, 246-1B, 246-2A, 246-2B, 246-3A, 246-3B, 246-4A, 246-4B, 246-5A and 246-5B over a substrate 200 (the substrate 200 is shown in FIGS. 1B and 1C).

In some embodiments, the semiconductor device structure 600A includes the first circuit 400A and the second circuit 400B arranged along a direction 302. An outer boundary 410A of the first circuit 400A and an outer boundary 410B of the second circuit 400B are illustrated using dashed lines, which mark rectangular regions. The second circuit 400B is adjacent to the first circuit 400A. Therefore, an overlap portion of the outer boundary 410A of the first circuit 400A and the outer boundary 410B of the second circuit 400B forms a common boundary portion 410 shared by the first circuit 400A and the second circuit 400B.

As shown in FIG. 1A, each of the first circuit 400A and the second circuit 400B includes the first device region 550A and the second device region 550B arranged along a direction 300 that is different from the direction 302. For example, the direction 300 is substantially perpendicular to the direction 302. The first device region 550A is adjacent to the second device region 550B. The first device region 550A and the second device region 550B divide each of the first circuit 400A and the second circuit 400B into two separate regions for different types of devices or transistors. Examples of transistors include, but are not limited to, metal oxide semiconductor field effect transistors (MOSFET), complementary metal oxide semiconductor (CMOS) transistors, bipolar junction transistors (BJT), high voltage transistors, high frequency transistors, P-type and/or N-type field effect transistors (PFETs/NFETs), FinFETs, planar MOS transistors with raised source/drains, or the like. In addition, the first device region 550A is a region for an N-type well (NW) region 252 formed therein, and the second device region 550B is a region for a P-type well (PW) region 254 formed therein. In addition, an outer boundary of the first device region 550A may overlap an outer boundary of the NW region 252, and an outer boundary of the second device region 550B may overlap an outer boundary of the PW region 254. Therefore, the first device region 550A may serve as a P-type FinFET region, and the second device region 550B may serve as an N-type FinFET region.

As shown in FIG. 1A, the semiconductor fins 204-1A, 204-1B, 204-2A and 204-2B parallel to each other are arranged along the direction 300 and extend along the direction 302. Therefore, the direction 302 serves as the longitudinal direction of the semiconductor fins 204-1A, 204-1B, 204-2A and 204-2B. For example, the semiconductor fins 204-1A and 204-1B may be arranged in the first device region 550A in each of the first circuit 400A and the second circuit 400B. The semiconductor fins 204-2A and 204-2B may be arranged in the second device region 550B in each of the first circuit 400A and the second circuit 400B. As shown in FIG. 1A, four semiconductor fins (the semiconductor fins 204-1A, 204-1B, 204-2A and 204-2B) are shown in accordance with some embodiments, but the number of semiconductor fins is not limited to the disclosed embodiments. In some other embodiments, the number of semiconductor fins in the first device region 550A and the second device region 550B of each of the first circuit 400A and the second circuit 400B is set to meet requirements.

In some embodiments, the semiconductor fins 204-1A, 204-1B are formed of SiGe, the Ge concentration in the first device region 550A (i.e. the P-type FinFET region) is in a range from about 10at % to about 40at %. In addition, the semiconductor fins 204-2A and 204-2B in the second device region 550B (i.e. the N-type FinFET region) may be formed of Si.

In some embodiments, as shown in FIG. 1A, the metal gate electrode structures 215-1A, 215-1B, 215-2A, 215-2B, 215-3A and 215-3B are arranged along the direction 302 and extend substantially along the direction 300. The metal gate electrode structures 215-1A, 215-2A, 215-3A, 215-1B, 215-2B and 215-3B are strip (line) shapes that are parallel to each other. The metal gate electrode structures 215-1A and 215-2A are positioned across the semiconductor fins 204-1A and 204-2A in the first device region 550A of the first circuit 400A. The metal gate electrode structure 215-3A is positioned across the semiconductor fins 204-1A and 204-2A in the first device region 550A of the second circuit 400B. The metal gate electrode structures 215-1B and 215-2B are positioned across the semiconductor fins 204-1B and 204-2B in the second device region 550B of the first circuit 400A. The metal gate electrode structure 215-3B is positioned across the semiconductor fins 204-1B and 204-2B in the second device region 550B of the second circuit 400B. As shown in FIG. 1A, six metal gate electrode structures are shown in accordance with some embodiments, but the number of metal gate electrode structures is not limited to the disclosed embodiments.

In some embodiments, each of the metal gate electrode structures 215-1A, 215-1B, 215-2A, 215-2B, 215-3A and 215-3B includes a gate dielectric (not shown) and a metal gate electrode (not shown) formed over the gate dielectric. In some embodiments, the gate dielectric is a high dielectric constant (high-k) dielectric material. A high-k dielectric material has a dielectric constant (k) higher than that of silicon dioxide. Examples of high-k dielectric materials include hafnium oxide, zirconium oxide, aluminum oxide, silicon oxynitride, hafnium dioxide-alumina alloy, hafnium silicon oxide, hafnium silicon oxynitride, hafnium tantalum oxide, hafnium titanium oxide, hafnium zirconium oxide, another suitable high-k material, or a combination thereof. In some embodiments, the metal gate electrode is made of a conductive material, such as aluminum (Al), copper (Cu), tungsten (W), titanium (Ti), tantalum (Ta), or another applicable material.

In some embodiments, each of the metal gate electrode structures 215-1A, 215-1B, 215-2A, 215-2B, 215-3A and 215-3B includes work function layers. For example, in some embodiments, each of the metal gate electrode structures 215-1A, 215-2A and 215-3A in the first device region 550A includes P-type work function layer(s). Each of the metal gate electrode structures 215-1B, 215-2B and 215-3B in the second device region 550B includes N-type work function layer(s). The P-type work function layer may include TiN, TaN, Ru, Mo, Al, WN, ZrSi2, MoSi2, TaSi2, NiSi2, WN, other suitable P-type work function materials, or a combination thereof. The N-type work function layer may include Ti, Ag, TaAl, TaAlC, TiAlN, TaC, TaCN, TaSiN, Mn, Zr, other suitable N-type work function materials, or a combination thereof.

In some embodiments, the metal gate electrode structures 215-1A, 215-2A and 215-3A, which are configured to form P-type FinFETs 500A1-500A3, are formed of a metal compound that includes one or more P-type work function layers. The metal gate electrode structures 215-1B, 215-2B and 215-3B, which are configured to form N-type FinFETs 500B1-500B3, may be formed of a metal compound that includes one or more N-type work function layers. Therefore, the first metal compound in the metal gate electrode structures 215-1B, 215-2B and 215-3B is different from the metal compound in metal gate electrode structures 215-1A, 215-2A and 215-3A.

In some embodiments, each of the metal gate electrodes in the first device region 550A is aligned and connected to the corresponding metal gate electrode in the second device region 550B of each of the first circuit 400A and the second circuit 400B. For example, the metal gate electrode structure 215-1A in the first device region 550A may be aligned with and connected to the corresponding metal gate electrode structure 215-1B in the second device region 550B along the direction 300. The metal gate electrode structure 215-2A in the first device region 550A may be aligned with and connected to the corresponding metal gate electrode structure 215-2B in the second device region 550B along the direction 300. The metal gate electrode structure 215-3A in the first device region 550A may be aligned with and connected to the corresponding metal gate electrode structure 215-3B in the second device region 550B along the direction 300.

In some embodiments, as shown in FIG. 1A, the metal gate electrode structure 215-1A and the corresponding semiconductor fins 204-1A and 204-2A in the first device region 550A form the P-type FinFET 500A1 in the first circuit 400A. The metal gate electrode structure 215-2A and the corresponding semiconductor fins 204-1A and 204-2A in the first device region 550A form the P-type FinFET 500A2 in the first circuit 400A. The metal gate electrode structure 215-3A and the corresponding semiconductor fins 204-1A and 204-2A in the first device region 550A may form the P-type FinFET 500A3 in the second circuit 400B. The metal gate electrode structure 215-1B and the corresponding semiconductor fins 204-1B and 204-2B in the second device region 550B may form the N-type FinFET 500B1, which is positioned beside the P-type FinFET 500A1, in the first circuit 400A. The metal gate electrode structure 215-2B and the corresponding semiconductor fins 204-1B and 204-2B in the second device region 550B may form the N-type FinFET 500B2, which is positioned beside the P-type FinFET 500A2, in the first circuit 400A. In addition, the metal gate electrode structure 215-3B and the corresponding semiconductor fins 204-1B and 204-2B in the second device region 550B may form the N-type FinFET 500B3, which is positioned beside the P-type FinFET 500A3, in the second circuit 400B. A portion of each of the semiconductor fins overlaps the corresponding metal gate electrode and may serve as a channel region of the FinFET. Two portions of each of the semiconductor fins on opposite sides of the corresponding metal gate electrode may serve as source/drain regions of the FinFET.

In some embodiments, as shown in FIG. 1A, the source/drain contacts 246-1A, 246-1B, 246-2A, 246-2B, 246-3A, 246-3B, 246-4A, 246-4B, 246-5A and 246-5B are positioned on the source/drain regions of the P-type FinFETs 500A1 500A3 and the N-type FinFETs 500B1-500B3 in the semiconductor device structure 600A. The source/drain contacts 246-1A, 246-1B, 246-2A, 246-2B, 246-3A, 246-3B, 246-4A, 246-4B, 246-5A and 246-5B are formed through a dielectric layer (e.g. the inter-layer dielectric (ILD) layer) 234, which is overlying the P-type FinFETs 500A1-500A3 and the N-type FinFETs 500B1-500B3. For example, the source/drain contacts 246-1A and 246-2A are positioned on the source/drain regions of the P-type FinFET 500A1. The source/drain contacts 246-2A and 246-3A are positioned on the source/drain regions of the P-type FinFET 500A2. The source/drain contacts 246-4A and 246-5A are positioned on the source/drain regions of the P-type FinFET 500A3. The source/drain contacts 246-1B and 246-2B are positioned on the source/drain regions of the N-type FinFET 500B1. The source/drain contacts 246-2B and 246-3B are positioned on the source/drain regions of the N-type FinFET 500B2. The source/drain contacts 246-4B and 246-5B are positioned on the source/drain regions of the N-type FinFET 500B3.

In the semiconductor device structure 600A, the source/drain contacts 246-1A, 246-1B, 246-2A, 246-2B, 246-3A, 246-3B, 246-4A, 246-4B, 246-5A and 246-5B are overlying and in contact with corresponding source/drain features in the source/drain regions of the FinFETs 500A1-500A3 and 500B1-500B3. As shown in FIG. 1B, the source/drain features 220-1A, 220-1B, 220-2A, 220-2B, 220-3A, 220-3B, 220-4A, 220-4B, 220-5A and 220-5B are partially embedded in each of the semiconductor fins 204-1A, 204-1B, 204-2A and 204-2B. Therefore, each of the semiconductor fins 204-1A, 204-1B, 204-2A and 204-2B have bottom surfaces lower than a top surface of each of the semiconductor fins 204-1A, 204-1B, 204-2A and 204-2B. The source/drain features 220-1A and 220-2A are positioned on the opposite sides of the metal gate electrode structure 215-1A of the P-type FinFET 500A1 and in contact with the source/drain contacts 246-1A and 246-2A in the first circuit 400A. The source/drain features 220-2A and 220-3A are positioned on the opposite sides of the metal gate electrode structure 215-2A of the P-type FinFET 500A2 and in contact with the source/drain contacts 246-2A and 246-3A in the first circuit 400A. The source/drain features 220-4A and 220-5A are positioned on the opposite sides of the metal gate electrode structure 215-3A of the P-type FinFET 500A3 and in contact with the source/drain contacts 246-4A and 246-5A in the second circuit 400B. Similarly, the source/drain features 220-1B and 220-2B are positioned on the opposite sides of the metal gate electrode structure 215-1B of the N-type FinFET 500B1 and in contact with the source/drain contacts 246-1B and 246-2B in the first circuit 400A. The source/drain features 220-2B and 220-3B are positioned on the opposite sides of the metal gate electrode structure 215-2B of the N-type FinFET 500B2 and in contact with the source/drain contacts 246-2B and 246-3B in the first circuit 400A. The source/drain features 220-4B and 220-5B are positioned on the opposite sides of the metal gate electrode structure 215-3B of the N-type FinFET 500B3 and in contact with the source/drain contacts 246-4B and 246-5B in the second circuit 400B.

In some embodiments, the source/drain features 220-1A, 220-1B, 220-2A, 220-2B, 220-3A, 220-3B, 220-4A, 220-4B, 220-5A and 220-5B are formed of a strained material having the lattice constant that is different from the lattice constant of the substrate 200. Therefore, the channel region of each of the FinFETs are strained or stressed to enhance carrier mobility of the device. For example, for the P-type FinFETs 500A1-500A3, the strained material may be configured to apply a compressive stress to enhance hole mobility in the at least one of the source/drain regions of the P-type FinFETs 500A1-500A3. For the N-type FinFETs 500B1-500B3, the strained material may be configured to apply a tensile stress to enhance electron mobility in the at least one of the source/drain regions of the N-type FinFETs 500B1-500B3. Examples of the strained material include, but are not limited to, Si, Ge, SiGe, SiGeC, SiC, GeSn, SiGeSn, SiP, SiCP, SiAs, InAs, InGaAs, InSb, GaAs, GaSb, InAlP, InP, C, combinations thereof, and other suitable materials. In some embodiments, the strained material for the P-type FinFETs 500A1-500A3 includes SiGe, SiGeC, Ge, Si, or a combination thereof. In some embodiments, the strained material for the N-type FinFETs 500B1-500B3 includes SiC, SiP, SiCP, Si, or a combination thereof.

In some embodiments, as shown in FIG. 1A, the semiconductor device structure 600A further includes the dummy gates 230A, 240A and 242A arranged along the direction 302 and extending substantially along the direction 300. The dummy gates 230A, 240A and 242A are strip (line) shapes that are parallel to each other. In addition, each of the dummy gates 230A, 240A and 242A crosses the semiconductor fins 204-1A, 204-1B, 204-2A and 204-2B.

As shown in FIGS. 1A-1C, the dummy gate 230A is positioned on a common boundary portion 410 shared by the first circuit 400A and the second circuit 400B. The dummy gate 240A is positioned close a portion of the outer boundary 410A of the first circuit 400A along the direction 300. The dummy gate 242A is positioned close a portion of the outer boundary 410B of the second circuit 400B along the direction 300. As shown in FIGS. 1A and 1B, the dummy gate 240A and the dummy gate 242A are positioned overlapping ends 205-1A, 205-1B, 205-2A and 205-2B of the semiconductor fins 204-1A, 204-1B, 204-2A and 204-2B and on opposite sides of the dummy gate 230A along the direction 302. In other words, the dummy gate 230A is positioned between the first circuit 400A and the adjacent second circuit 400B and on the overlap boundary portion (the common boundary portion 410) between the outer boundary 410A of the first circuit 400A and the outer boundary 410B of the second circuit 400B. The dummy gate 240A and the dummy gate 242A are positioned adjacent to sidewalls of the ends 205-1A, 205-1B, 205-2A and 205-2B of the semiconductor fins 204-1A, 204-1B, 204-2A and 204-2B without overlapping top surfaces of ends 205-1A, 205-1B, 205-2A and 205-2B.

In some embodiments, the dummy gates 230A, 240A and 242A are arranged parallel to the metal gate electrode structures 215-1A, 215-1B, 215-2A, 215-2B, 215-3A and 215-3B. In addition, the width (along the direction 302) of each of the dummy gates 230A, 240A and 242A may be similar to or the same as the width (along the direction 302) of the metal gate electrode structures 215-1A, 215-1B, 215-2A, 215-2B, 215-3A and 215-3B. In some embodiments, a distance between a dielectric dummy gate and an adjacent metal gate electrode is equal to a corresponding distance between the metal gate electrodes along the direction 302. For example, a center-to-center distance, or spacing, along the direction 302 between one of the dummy gates 230A, 240A and 242A and the adjacent metal gate electrode structures is equal to the spacing along the direction 302 between the adjacent metal gate electrode structures 215-1A, 215-2A and 215-3A or between adjacent metal gate electrode structures 215-1B, 215-2B, and 215-3B.

As shown in FIG. 1A, each of the dummy gates 230A, 240A and 242A may include a first portion and a second portion adjacent to the first portion and aligned to the first portion along the direction 300. For example, the dummy gate 230A may include a first portion 230A1 and a second portion 230A2 adjacent to and connected to the first portion 230A1 shown in FIG. 1A and FIG. 1C. The first portion 230A1 of the dummy gate 230A is positioned between the P-type FinFET 500A2 in the first circuit 400A and the P-type FinFET 500A3 in the second circuit 400B. The second portion 230A2 of the dummy gate 230A is positioned the between the N-type FinFET 500B2 in the first circuit 400A and the N-type FinFET 500B3 in the second circuit 400B. For example, the dummy gate 240A includes a first portion 240A1 and a second portion 240A2 adjacent to the first portion 240A1. The first portion 240A1 of the dummy gate 240A is positioned adjacent to the ends 205-1A and 205-2A of the semiconductor fins 204-1A and 204-2A in the first circuit 400A. The second portion 240A2 of the dummy gate 240A is positioned adjacent to the ends 205-1B and 205-2B of the semiconductor fins 204-1B and 204-2B in the first circuit 400A. For example, the dummy gate 242A includes a first portion 242A1 and a second portion 242A2 adjacent to the first portion 242A1. The first portion 242A1 of the dummy gate 242A is positioned adjacent to the ends 205-1A and 205-2A of the semiconductor fins 204-1A and 204-2A in the second circuit 400B. The second portion 242A2 of the dummy gate 242A is positioned adjacent to the ends 205-1B and 205-2B of the semiconductor fins 204-1B and 204-2B in the second circuit 400B.

As shown in FIGS. 1A and 1B, the source/drain feature 220-3A (and the corresponding source/drain contact 246-3A) of the P-type FinFET 500A2 in the first circuit 400A and the source/drain feature 220-4A (and the corresponding source/drain contact 246-4A) of the P-type FinFET 500A3 in the second circuit 400B are positioned on the opposite sides of the first portion 230A1 of the dummy gates 230A. The source/drain feature 220-3B (and the corresponding source/drain contact 246-3B) of the N-type FinFET 500B2 in the first circuit 400A and the source/drain feature 220-4B (and the corresponding source/drain contact 246-4B) of the N-type FinFET 500B3 in the second circuit 400B are positioned on the opposite sides of the second portion 230A2 of the dummy gates 230A. In some embodiments, the distance between the source/drain feature 220-3A (or the corresponding source/drain contact 246-3A) and the first portion 230A1 of the dummy gates 230A is the same as the distance between the source/drain feature 220-3A (or the corresponding source/drain contact 246-3A) and the metal gate electrode structure 215-3A.

As shown in FIG. 1B, the top surfaces of the dummy gates 230A, 240A and 242A may be aligned to the top surface of the metal gate electrode structures 215-1A, 215-1B, 215-2A, 215-2B, 215-3A and 215-3B. The bottom surface of the dummy gates 230A, 240A and 242A may be positioned close to the bottoms of the semiconductor fins 204-1A, 204-2A, 204-1B and 204-2B (the bottoms of the semiconductor fins 204-1A, 204-2A, 204-1B and 204-2B are aligned to the bottom of isolating feature 206 adjacent to the ends 205-1A, 205-2A, 205-1B and 205-2B of the semiconductor fins 204-1A, 204-2A, 204-1B and 204-2B). In some embodiments, the dummy gate 230A between the first circuit 400A and the second circuit 400B may be formed over the semiconductor fins 204-1A, 204-2A, 204-1B and 204-2B and may extend into the semiconductor fins 204-1A, 204-2A, 204-1B and 204-2B. The dummy gate 230A may be formed by cutting off the semiconductor fins 204-1A, 204-2A, 204-1B and 204-2B at the common boundary portion 410. Therefore, the semiconductor fins 204-1A, 204-2A, 204-1B and 204-2B are not shown in FIG. 1C.

As shown in FIG. 1A, the first portion (230A1, 240A1 and 242A1) of each of the dummy gates 230A, 240A and 242A may be positioned in the first device region 550A and formed of a first strain dielectric material. The second portion (230A2, 240A2 and 242A2) of each of the dummy gates 230A, 240A and 242A may be positioned in the second device region 550B and formed of a second strain dielectric material. In some embodiments, the first material and the second strain material are different strain materials (with different stress types). For example, the first portion 230A1 of the dummy gate 230A, the first portion 240A1 of the dummy gate 240A and first portion 242A1 of the dummy gate 242A in the first device region (P-type FinFET region) 550A may be formed of compressive strain dielectric materials. In addition, the second portion 230A2 of the dummy gate 230A, the second portion 240A2 of the dummy gate 240A and the second portion 242A2 of the dummy gate 242A in the second device region (N-type FinFET region) 550B may be formed of tensile dielectric materials. In some embodiments, the compressive strain dielectric materials or the tensile dielectric materials include nitride or a combination of nitride, oxide and high-k dielectric materials (e.g. the dielectric constant (k) of the high-k dielectric materials is higher than 4). For example, the compressive strain dielectric materials or the tensile dielectric materials include silicon oxide, silicon nitride, silicon oxynitride, or a combination thereof. The high-k dielectric materials may have a dielectric constant (k) higher than that of silicon dioxide (larger than 4). Examples of the high-k dielectric materials include hafnium oxide, zirconium oxide, aluminum oxide, silicon oxynitride, hafnium dioxide-alumina alloy, hafnium silicon oxide, hafnium silicon oxynitride, hafnium tantalum oxide, hafnium titanium oxide, hafnium zirconium oxide, another suitable high-k material, or a combination thereof. It should be noted that the first portions 230A1, 240A1 and 242A1 and the second portions 230A2, 240A2 and 242A2 of the dummy gates 230A, 240A and 242A do not include metal materials therein.

As shown in FIGS. 1A-1C, spacers 218 are formed along sides of the corresponding metal gate electrode structures 215-1A, 215-1B, 215-2A, 215-2B, 215-3A and 215-3B and the dummy gates 230A, 240A and 242A. In other words, the spacers 218 surround the corresponding metal gate electrode structures 215-1A, 215-1B, 215-2A, 215-2B, 215-3A and 215-3B and the dummy gates 230A, 240A and 242A shown in FIG. 1A. In some embodiments, the spacers 218 include one or more dielectric materials for electrically isolating the corresponding metal gate electrode structures 215-1A, 215-1B, 215-2A, 215-2B, 215-3A and 215-3B from the source/drain contacts 246-1A, 246-1B, 246-2A, 246-2B, 246-3A, 246-3B, 246-4A, 246-4B, 246-5A and 246-5B. In addition, the adjacent metal gate electrode structures in the first device region 550A and the second device region 550B may be not separated from each other by the corresponding spacer 218. Furthermore, the first portion and the second portion of the same dielectric dummy gate in the first device region 550A and the second device region 550B may be not separated from each other by the corresponding spacer 218. In some embodiments, the spacers 218 may be formed of silicon nitride, oxynitride and silicon carbide. In some embodiments, the spacers 218 have a tapered profile in a cross-sectional view as shown in FIGS. 1B and 1C.

In some embodiments, as shown in FIGS. 1A-1C, the semiconductor device structure 600A includes the dummy gate 230A positioned on the common boundary portion 410 shared by the first circuit 400A and the second circuit 400B. The dummy gate 230A is formed by cutting off the semiconductor fins 204-1A, 204-2A, 204-1B and 204-2B. The dummy gate 230A includes two portions adjacent to each other. The first portion 230A1 of the dummy gate 230A is adjacent the P-type FinFETs (500A2 and 500A3) and filled by the compressive strain dielectric material to improve the hole mobility of the adjacent P-type FinFETs. In addition, the second portion 230A2 of the dummy gate 230A is adjacent the N-type FinFETs (500B2 and 500B3) and filled by the tensile dielectric material to improve the hole mobility of the adjacent N-type FinFETs. The semiconductor device structure 600A may further include the dummy gate 240A and the dummy gate 242A positioned on the ends of the semiconductor fins 204-1A, 204-1B, 204-2A and 204-2B in the first circuit 400A and the second circuit 400B. The dummy gate 240A and the dummy gate 242A may help to improve the reliability of the FinFETs close to the ends of the semiconductor fins.

Figure 2A:
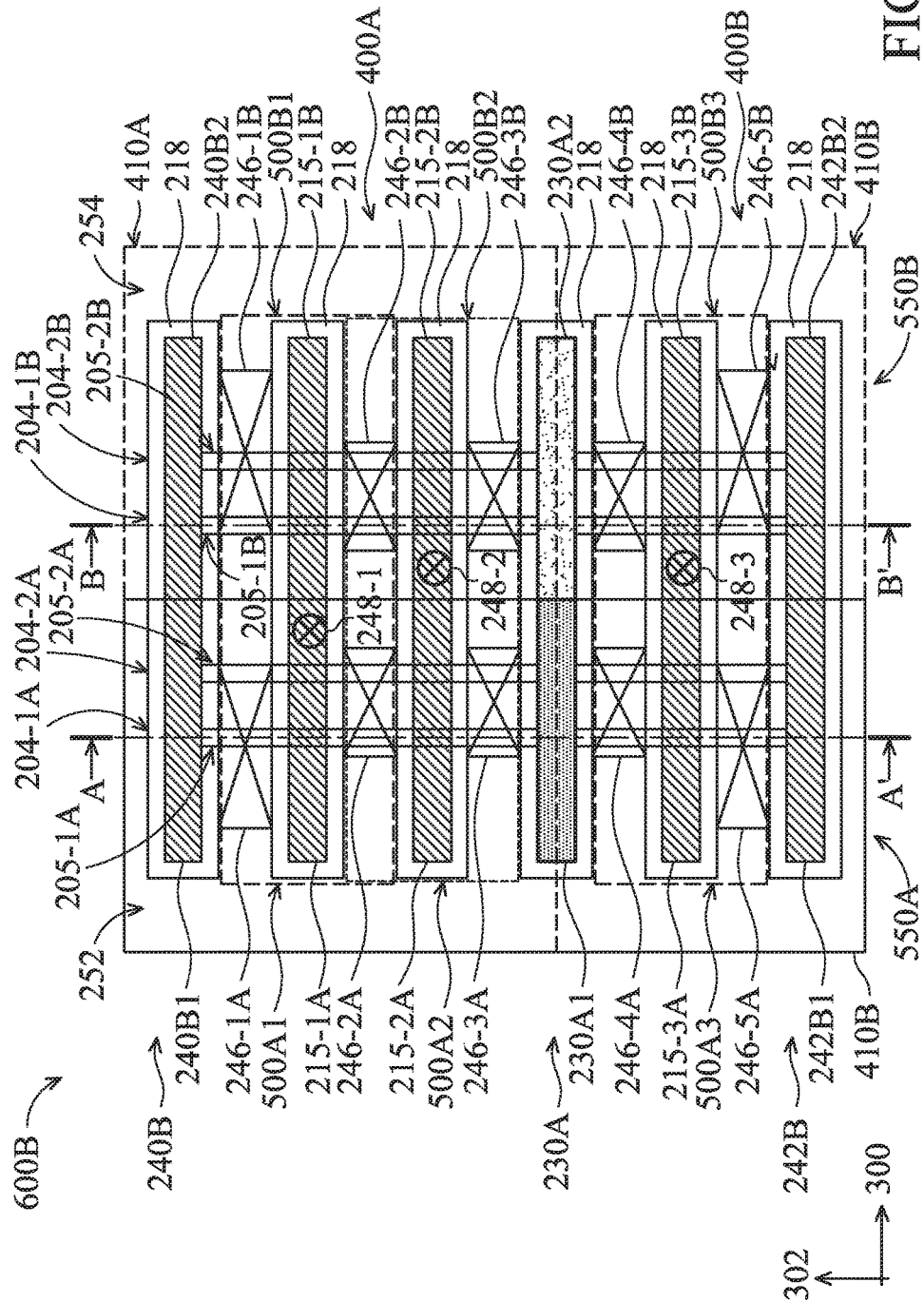
FIG. 2A is a top view of a layout of a semiconductor device structure in accordance with some embodiments.
Figure 2B:
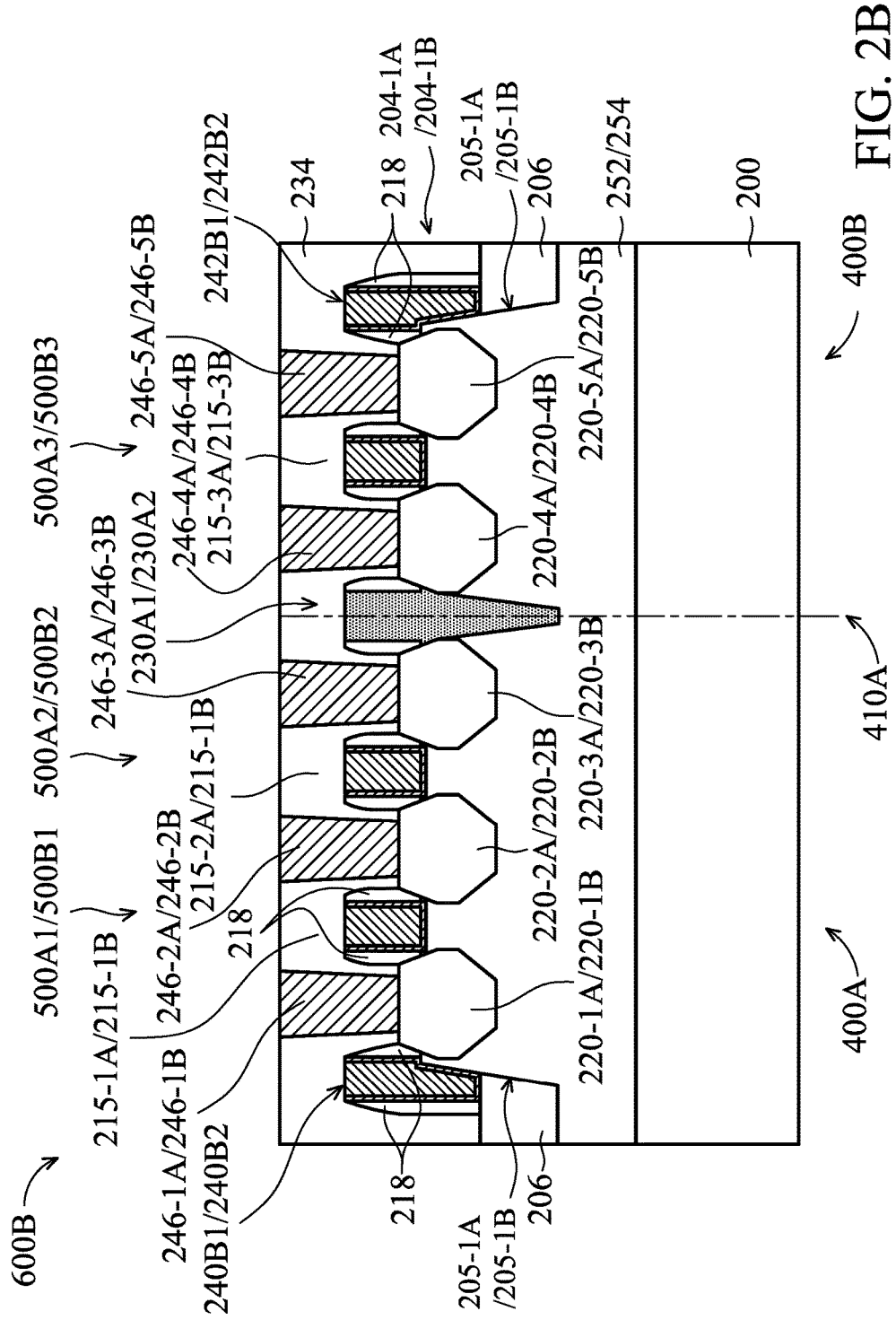
FIG. 2B illustrates a cross-sectional view taken along line A-A' or line B-B' of FIG. 2A, showing cross-sectional views of a semiconductor device structure in accordance with embodiments.

FIG. 2A is a top view of a layout of a semiconductor device structure 600B in accordance with some embodiments. It should be noted that some features, for example, the isolating features, the source/drain features and the dielectric layer (e.g. the inter-layer dielectric (ILD) layer 234) are not shown in FIG. 2A for clarity. FIG. 2B illustrates a cross-sectional view taken along line A-A' or line B-B' of FIG. 2A, showing cross-sectional views of a semiconductor device structure in accordance with embodiments. The materials, configurations, structures, processes and/or arrangements utilized in elements of the semiconductor device structure 600B that are similar to those employed in the semiconductor device structure 600A shown in FIGS. 1A to 1C are not repeated herein. One of the differences between the semiconductor device structure 600A and the semiconductor device structure 600B is that the semiconductor device structure 600B includes dummy gate 240B and the dummy gate 242B are positioned overlapping ends 205-1A, 205-1B, 205-2A and 205-2B of the semiconductor fins 204-1A, 204-1B, 204-2A and 204-2B and on opposite sides of the dummy gate 230A along the direction 302. The dummy gate 240B and the dummy gate 242B are positioned overlapping sidewalls of the ends 205-1A, 205-1B, 205-2A and 205-2B of the semiconductor fins 204-1A, 204-1B, 204-2A and 204-2B extending over the top surfaces of ends 205-1A, 205-1B, 205-2A and 205-2B.

In some embodiments, the dummy gate 240B includes a first portion 240B1 and a second portion 240B2 adjacent to the first portion 240B1. The materials, configurations and/or structures utilized in elements of the first portion 240B1 of the dummy gate 240B are similar to those employed in the metal gate electrode structures 215-1A, 215-2A and 215-3A shown in FIGS. 1A-1B. The materials, configurations and/or structures utilized in elements of the second portion 240B2 of the dummy gate 240B are similar to those employed in the metal gate electrode structures 215-1B, 215-2B and 215-3B shown in FIGS. 1A-1B. For example, the first portion 240B1 of the dummy gate 240B may be formed of a metal compound that includes one or more P-type work function layers used in the metal gate electrode structures 215-1A, 215-2A and 215-3A. The second portion 240B2 of the dummy gate 240B may be formed of a metal compound that includes one or more N-type work function layers used in the metal gate electrode structures 215-1B, 215-2B and 215-3B.

In some embodiments, the dummy gate 242B includes a first portion 242B1 and a second portion 242B2 adjacent to the first portion 242B1. The materials, configurations, structures and/or arrangements utilized in elements of the first portion 242B1 and the second portion 242B2 of the dummy gate 242B are similar to those employed in the first portion 240B1 and the second portion 240B2 of the dummy gate 202B.

In some embodiments, as shown in FIGS. 2A-2B, the semiconductor device structure 600B includes the metal dummy gate 240B and the metal dummy gate 242B positioned on the ends of the semiconductor fins 204-1A, 204-1B, 204-2A and 204-2B in the first circuit 400A and the second circuit 400B. The metal dummy gate 240B and the metal dummy gate 242B are formed of the metal compound similar to the adjacent metal gate electrode structures. The metal dummy gate 240B and the metal dummy gate 242B may help to improve the reliability of the FinFETs close to the ends of the semiconductor fins.

Figure 3A:
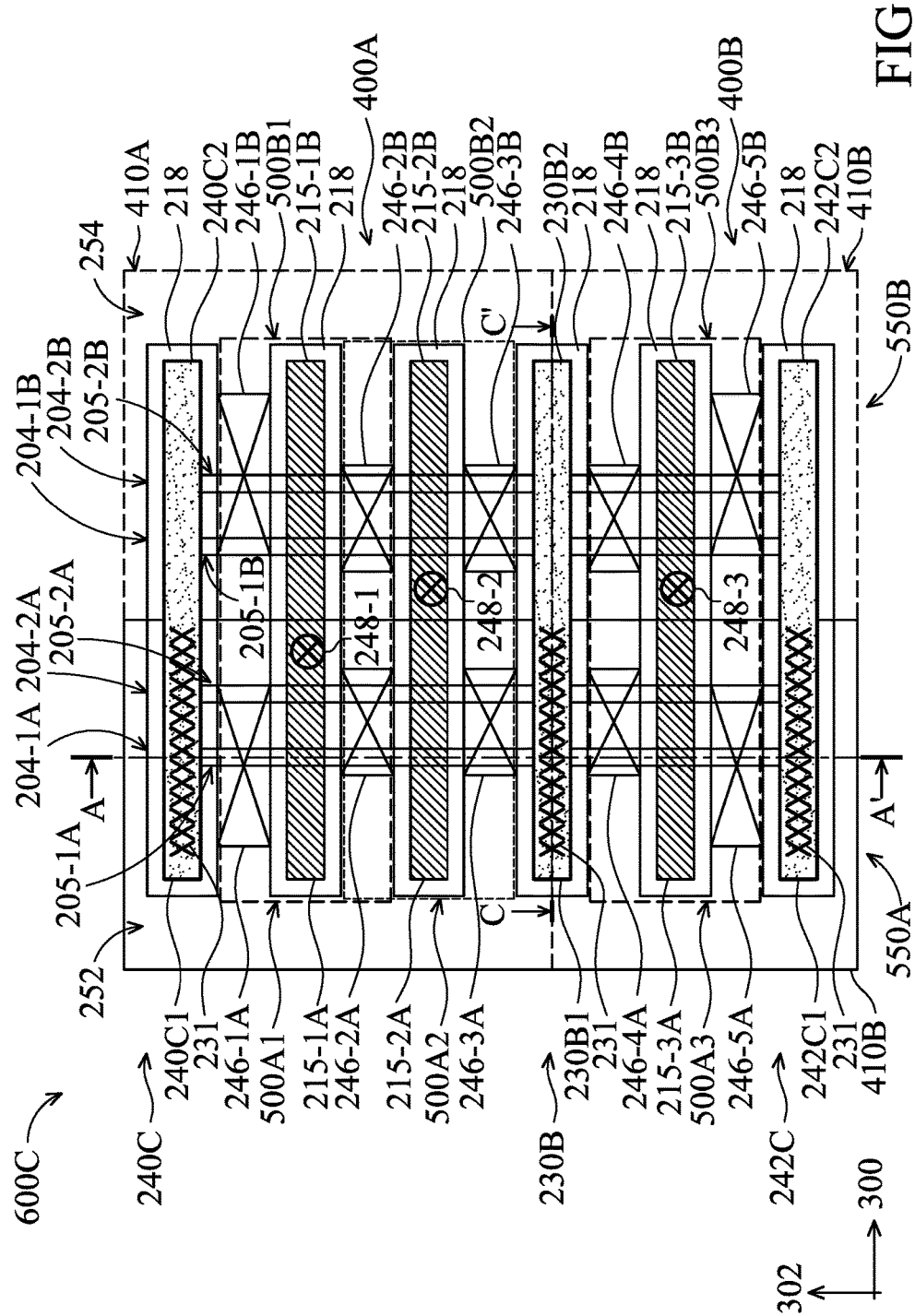
FIG. 3A is a top view of a layout of a semiconductor device structure in accordance with some embodiments.
Figure 3B:
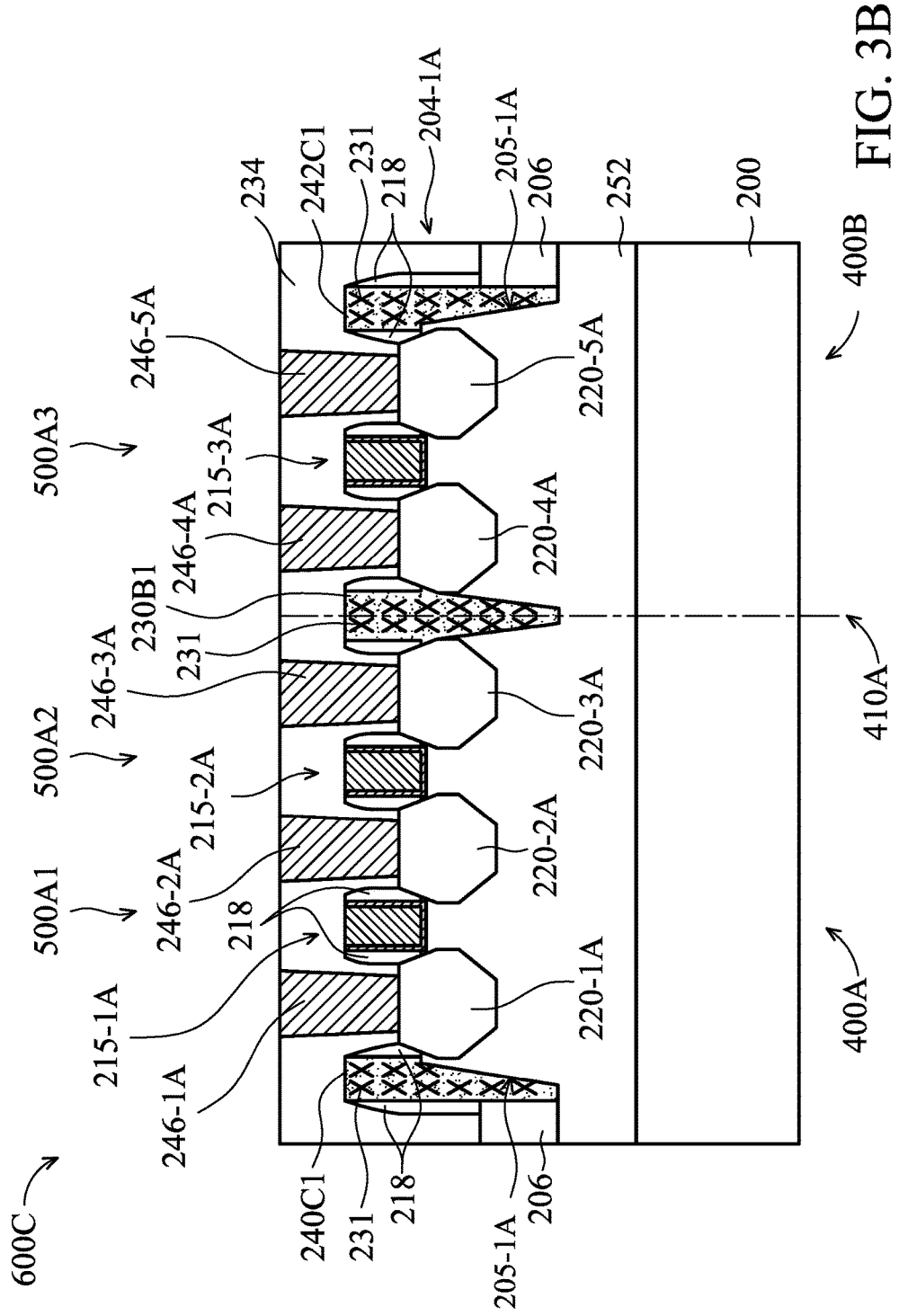
FIG. 3B illustrates a cross-sectional view taken along line A-A' or line B-B' of FIG. 3A, showing cross-sectional views of a semiconductor device structure in accordance with embodiments.

FIG. 3A illustrates a top view of a layout of a semiconductor device structure 600C in accordance with some embodiments. It should be noted that some features, for example, the isolating features, the source/drain features and the dielectric layer (e.g. the inter-layer dielectric (ILD) layer 234) are not shown in FIG. 3A for clarity. FIG. 3B illustrates a cross-sectional view taken along line A-A' of FIG. 3A. FIG. 3C illustrates a cross-sectional view taken along line C-C' of FIG. 3A. The materials, configurations, structures, processes and/or arrangements utilized in elements of the semiconductor device structure 600C that are similar to those employed in the semiconductor device structure 600A shown in FIGS. 1A to 1C are not repeated herein. One of the differences between the semiconductor device structure 600A and the semiconductor device structure 600C is that the semiconductor device structure 600C includes the dummy gates 230B, 240C and 242C arranged along the direction 302 and extending substantially along the direction 300. The positions of the dummy gates 230B, 240C and 242C may respectively be the same as or similar to the dummy gates 230A, 240A and 242A.

As shown in FIGS. 3A-3C, each of the dummy gates 230B, 240C and 242C may include a first portion in the first device region 550A and a second portion adjacent to the first portion and in the second device region 550B. In some embodiments, the positions of first portions and second portions of the dummy gates 230B, 240C and 242C are respectively the same as or similar to those of the first portions 230A1, 240A1 and 242A1 and the second portions 230A2, 240A2 and 242A2 of the dummy gates 230A, 240A and 242A. It should be noted that the first portions 230B1, 240C1 and 242C1 and the second portions 230B2, 240C2 and 242C2 of the dummy gates 230B, 240C and 242C are formed of the same strain dielectric material. In addition, the dummy gates 230B, 240C and 242C may further include dopants 231 distributed in the first portions 230B1, 240C1 and 242C1. The second portions 230B2, 240C2 and 242C2 of the dummy gates 230B, 240C and 242C are formed without the dopants 231 distributed within.

In some embodiments, the first portions 230B1, 240C1 and 242C1 and the second portions 230B2, 240C2 and 242C2 of the dummy gates 230B, 240C and 242C are formed of the tensile dielectric materials including nitride or a combination of nitride, oxide and high-k dielectric materials (e.g. the dielectric constant (k) of the high-k dielectric materials is higher than 4). In some embodiments, the dopants 231 are configured to release the tensile stress in the first portions 230B1, 240C1 and 242C1 of the dummy gates 230B, 240C and 242C in the first device region (P-type device region) 550A. The dopants 231 may include Ge, Si, In, P, As, F, N, C, B or a combination thereof. For example, the dopants 231 may be Ge, Si or B.

Figure 4A:
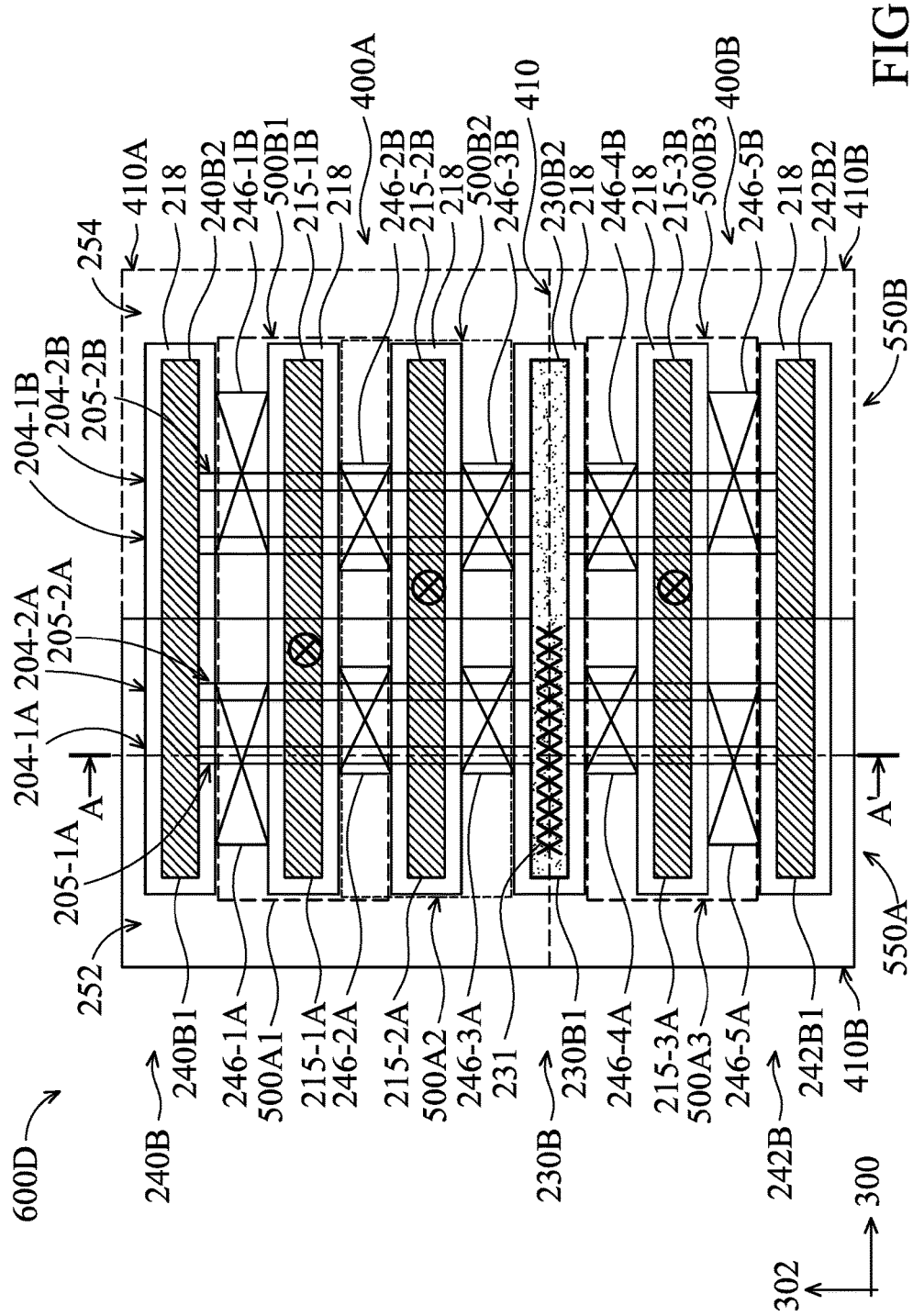
FIG. 4A is a top view of a layout of a semiconductor device structure in accordance with some embodiments.
Figure 4B:
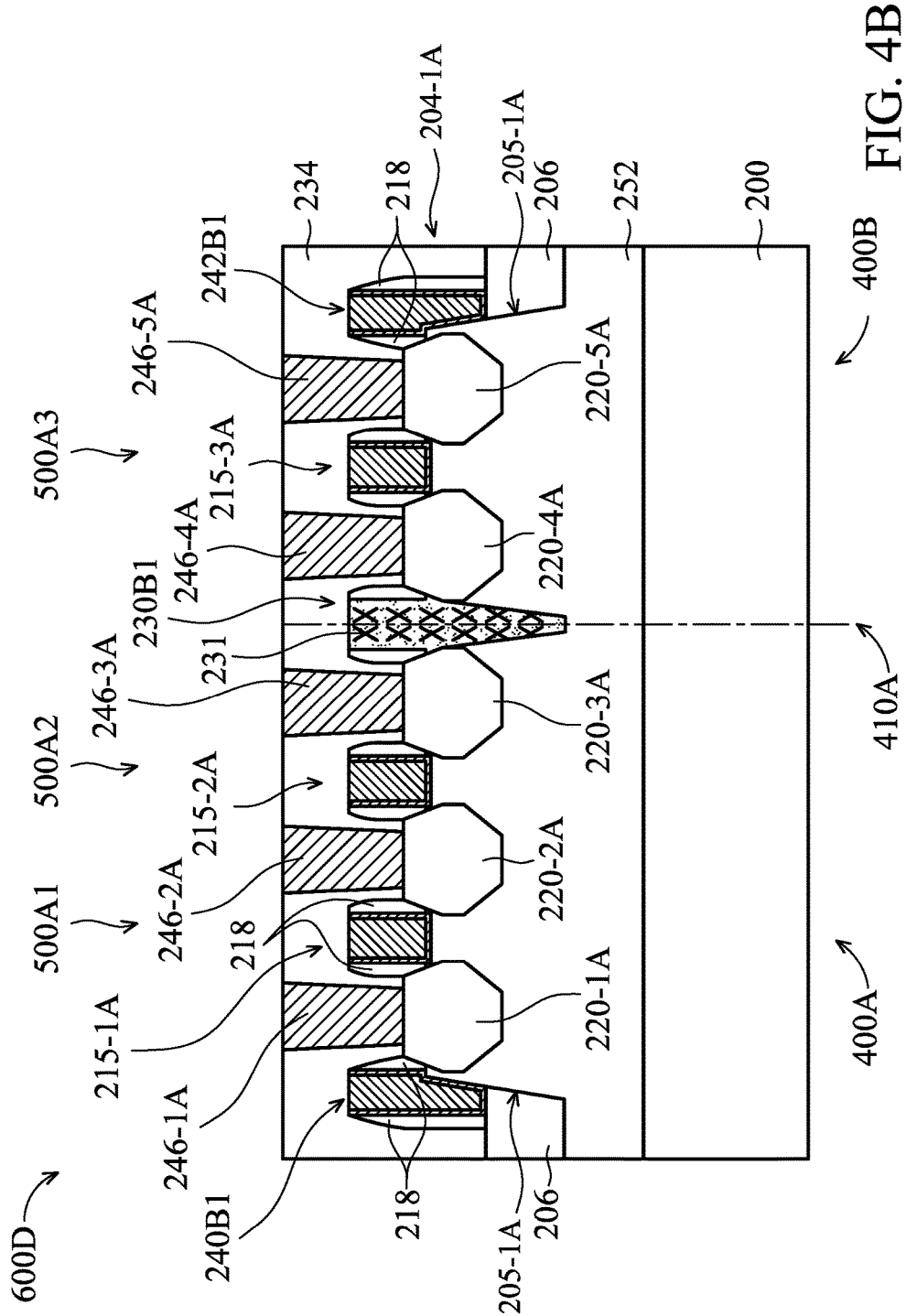
FIG. 4B illustrates a cross-sectional view taken along line A-A' or line B-B' of FIG. 4A, showing cross-sectional views of a semiconductor device structure in accordance with embodiments.

FIG. 4A is a top view of a layout of a semiconductor device structure 600D in accordance with some embodiments. It should be noted that some features, for example, the source/drain features and the dielectric layer (e.g. the inter-layer dielectric (ILD) layer) are not shown in FIG. 4A for clarity. FIG. 4B illustrates a cross-sectional view taken along line A-A' of FIG. 4A. The materials, configurations, structures, processes and/or arrangements utilized in elements of the semiconductor device structure 600D that are similar to those employed in the semiconductor device structures 600A-600C shown in FIGS. 1A-1C, 2A-2B and 3A-3C are not repeated herein. One of the differences between the semiconductor device structure 600C and the semiconductor device structure 600D is that the semiconductor device structure 600D includes the dummy gate 240B and the dummy gate 242B positioned overlapping ends 205-1A, 205-1B, 205-2A and 205-2B of the semiconductor fins 204-1A, 204-1B, 204-2A and 204-2B and on opposite sides of the dummy gate 230B along the direction 302. In some embodiments, the materials, configurations, structures, processes and/or arrangements utilized in the dummy gate 240B and the dummy gate 242B of the semiconductor device structure 600D are similar to those employed in the in the dummy gate 240B and the dummy gate 242B of the semiconductor device structure 600B.

Figure 5A:
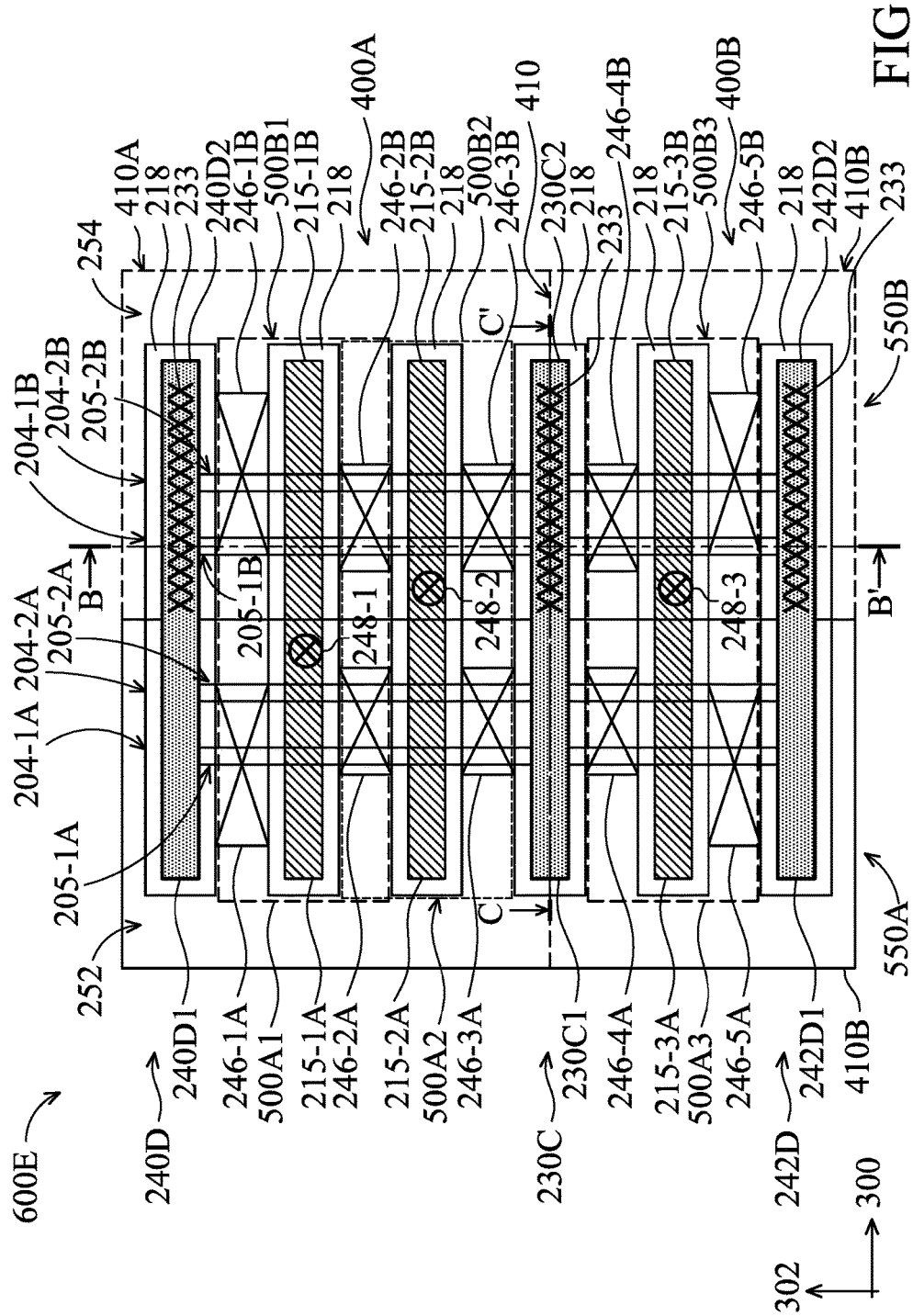
FIG. 5A is a top view of a layout of a semiconductor device structure in accordance with some embodiments.
Figure 5B:
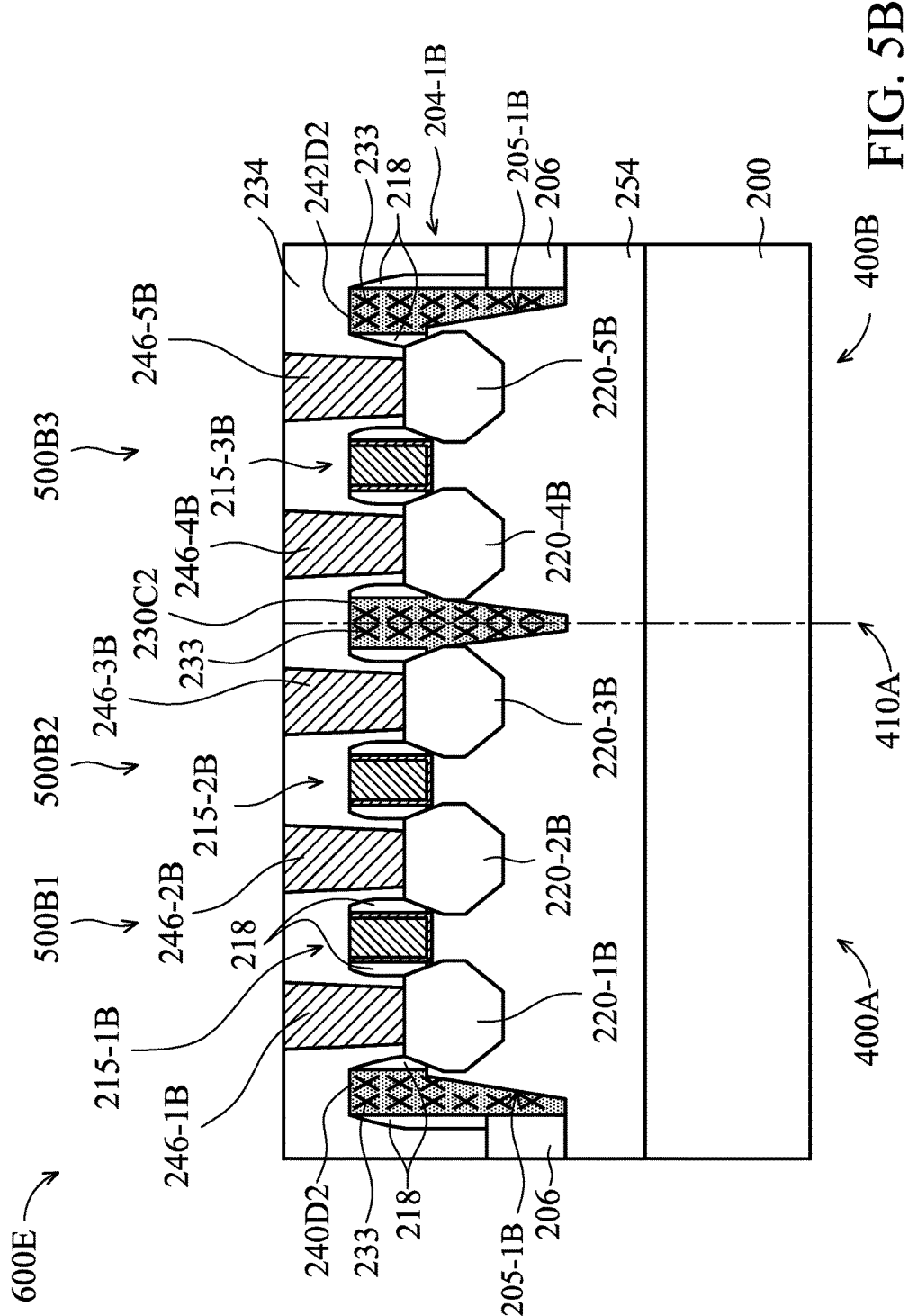
FIG. 5B illustrates a cross-sectional view taken along line A-A' or line B-B' of FIG. 5A, showing cross-sectional views of a semiconductor device structure in accordance with embodiments.
Figure 5C:
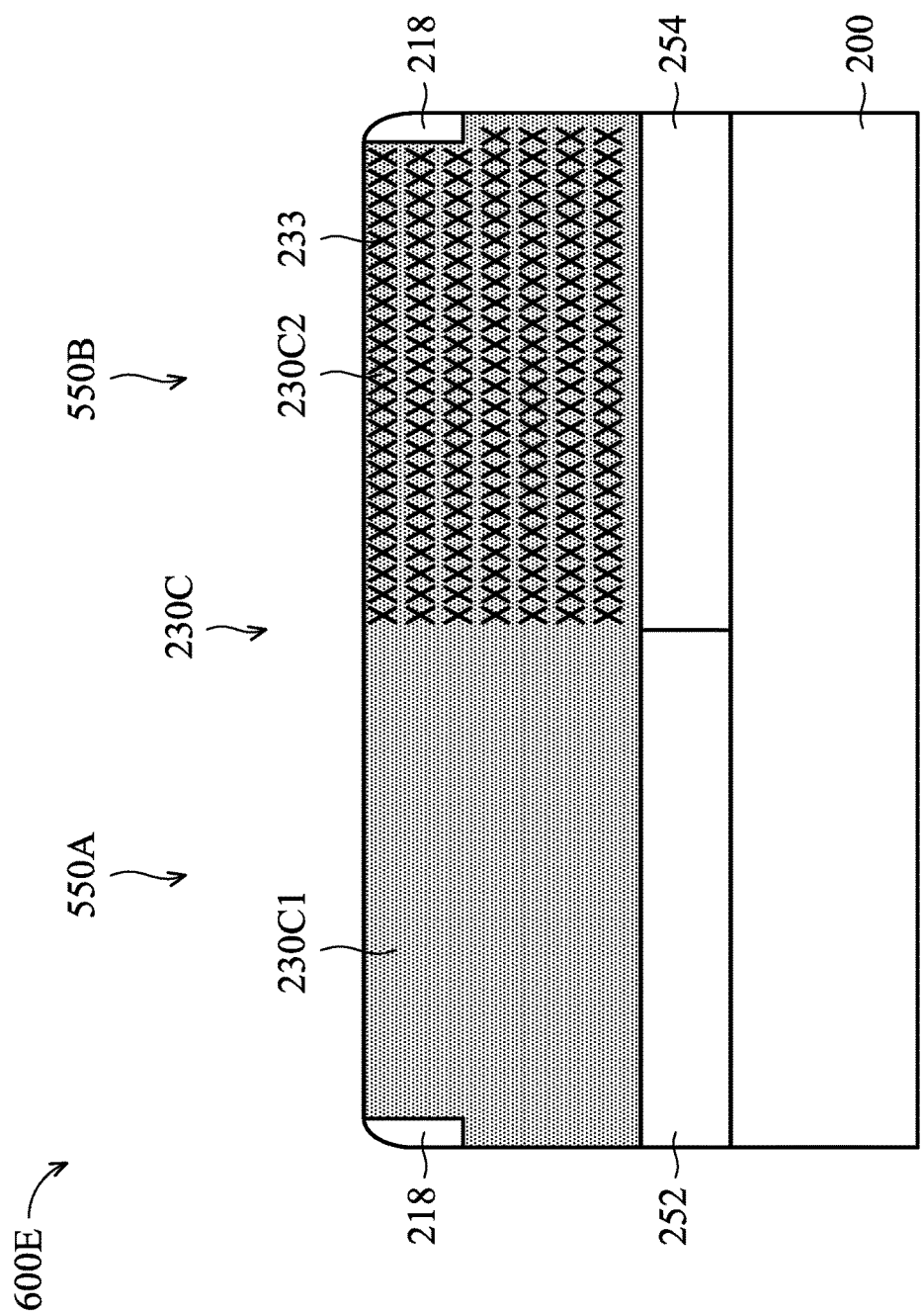
FIG. 5C illustrates a cross-sectional view taken along line C-C' of FIG. 5A, showing cross-sectional views of a semiconductor device structure in accordance with embodiments.

FIG. 5A illustrates a top view of a layout of a semiconductor device structure 600E in accordance with some embodiments. It should be noted that some features, for example, the source/drain features and the dielectric layer (e.g. the inter-layer dielectric (ILD) layer 134) are not shown in FIG. 5A for clarity. FIG. 5B illustrates a cross-sectional view taken along line B-B' of FIG. 5A. FIG. 5C illustrates a cross-sectional view taken along line C-C' of FIG. 5A. The materials, configurations, structures, processes and/or arrangements utilized in elements of the semiconductor device structure 600E that are similar to those employed in the semiconductor device structures 600A and 600C shown in FIGS. 1A-1C and 3A-3C are not repeated herein. One of the differences between the semiconductor device structure 600C and the semiconductor device structure 600E is that the semiconductor device structure 600E includes the dummy gates 230C, 240D and 242D arranged along the direction 300 and extending substantially along the direction 302. The positions of the dummy gates 230C, 240D and 242D may be respectively the same as or similar to the dummy gates 230B, 240C and 242C.

As shown in FIGS. 5A-5C, each of the dummy gates 230C, 240D and 242D may include a first portion in the first device region 550A and a second portion adjacent to the first portion and in the second device region 550B. In some embodiments, the positions of first portions and second portions of the dummy gates 230C, 240D and 242D are respectively the same as or similar to those of the first portions 230B1, 240C1 and 242C1 and the second portions 230B2, 240C2 and 242C2 of the dummy gates 230B, 240C and 242C. It should be noted that the first portions 230C1, 240D1 and 242D1 and second portions 230C2, 240D2 and 242D2 of the dummy gates 230C, 240D and 242D are formed of the same strain material. In addition, the dummy gates 230C, 240D and 242D further include dopants 233 distributed in the second portions 230C2, 240D2 and 242D2. The first portions 230C1, 240D1 and 242D of the dummy gates 230C2, 240D2 and 242D2 are formed without the dopants 233 distributed within.

In some embodiments, the first portions 230C1, 240D1 and 242D1 and the second portions 230C2, 240D2 and 242D2 of the dummy gates 230C, 240D and 242D are formed of the compressive strain dielectric materials including nitride or a combination of nitride, oxide and high-k dielectric materials (e.g. the dielectric constant (k) of the high-k dielectric materials is higher than 4). In some embodiments, the dopants 233 are configured to change the stress in the second portions 230C2, 240D2 and 242D2 of the dummy gates 230C, 240D and 242D in the second device region (N-type device region) 550B from compressive to tensile. The dopants 233 include Ge, Si, In, P, As, F, N, C, B or a combination thereof. For example, the dopants 233 may be Ge, Si or B.

Figure 6A:
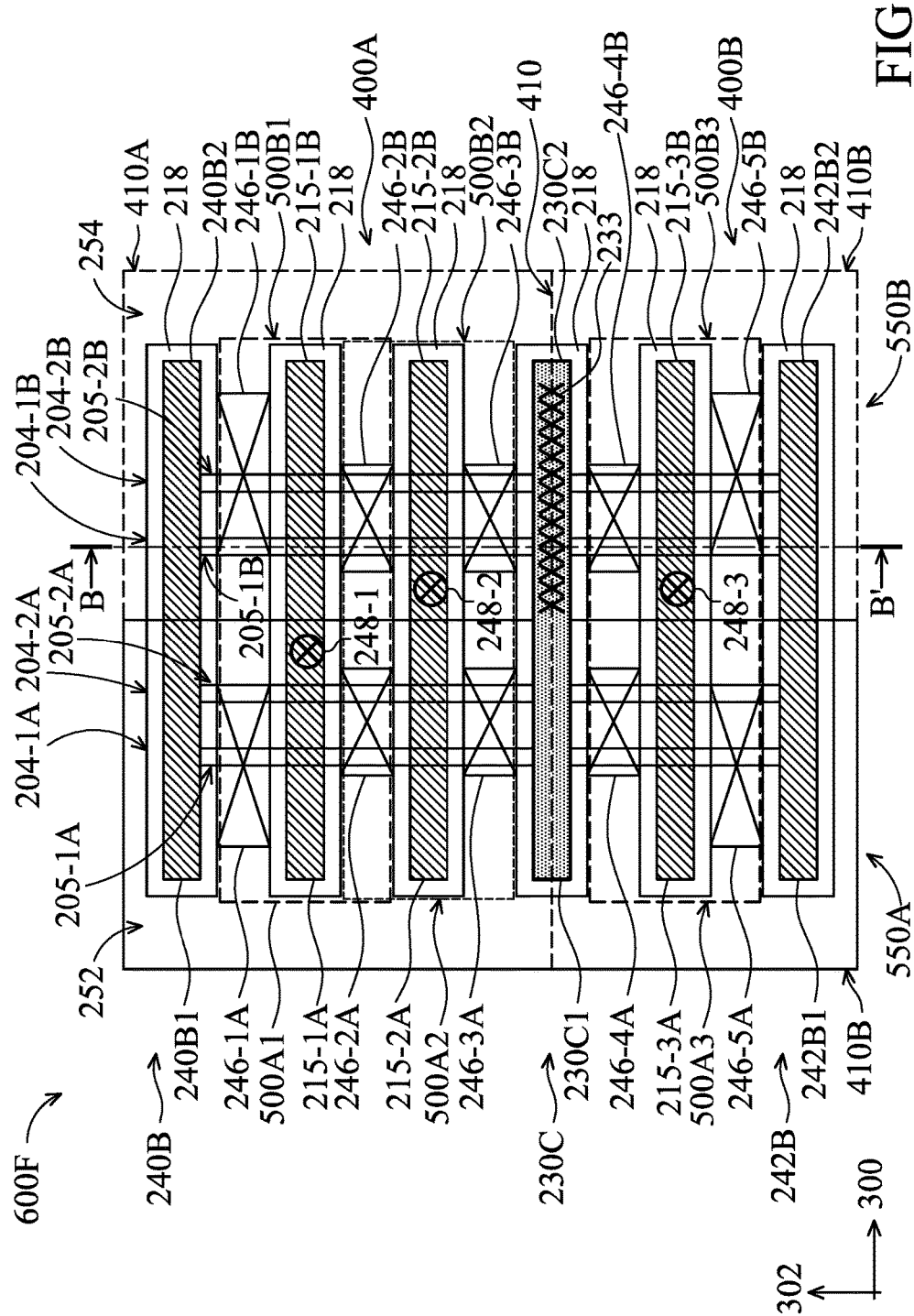
FIG. 6A is a top view of a layout of a semiconductor device structure in accordance with some embodiments.
Figure 6B:
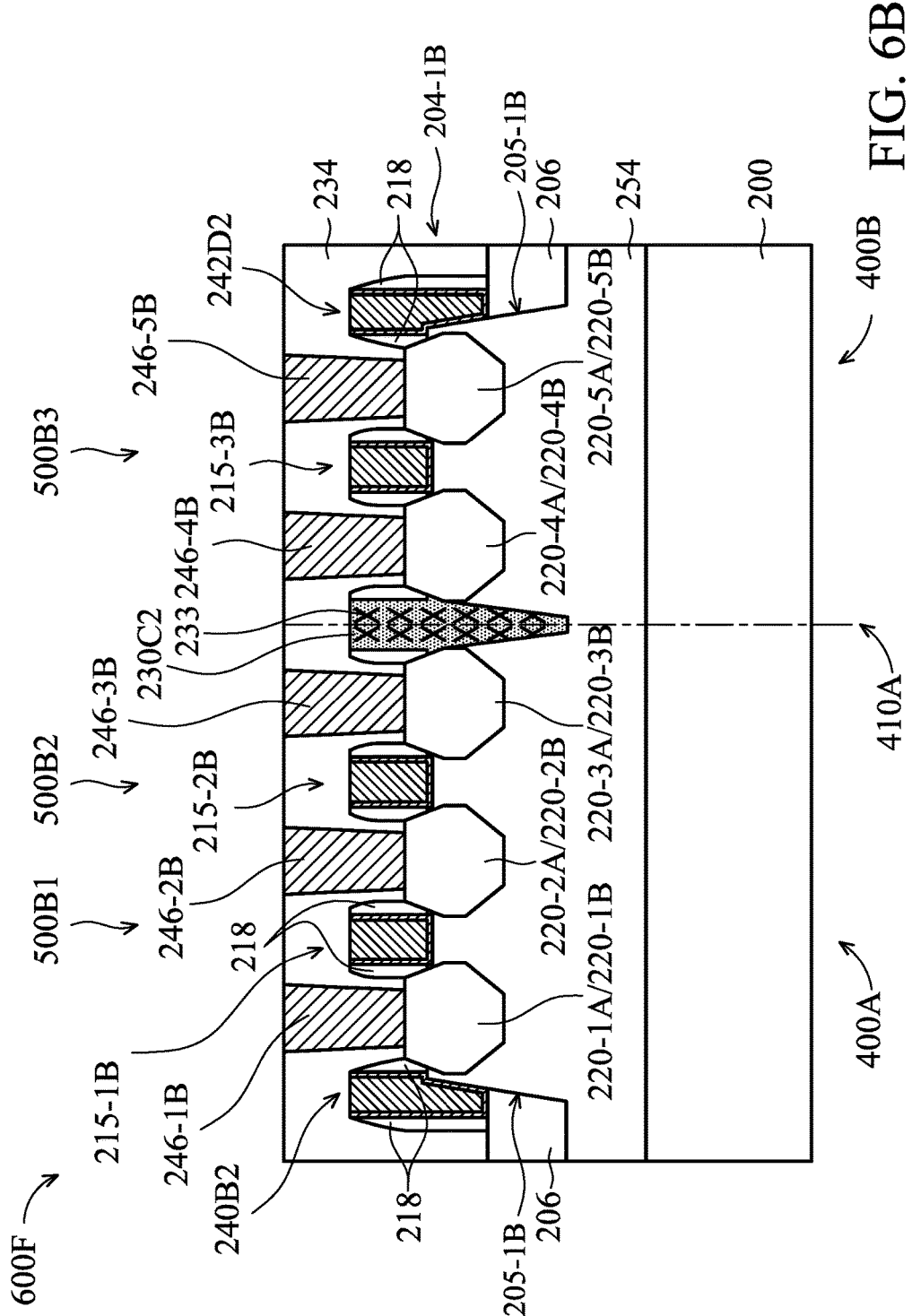
FIG. 6B illustrates a cross-sectional view taken along line A-A' or line B-B' of FIG. 6A, showing cross-sectional views of a semiconductor device structure in accordance with embodiments.

FIG. 6A is a top view of a layout of a semiconductor device structure 600F in accordance with some embodiments. It should be noted that some features, for example, the isolating features, the source/drain features and the dielectric layer (e.g. the inter-layer dielectric (ILD) layer 234) are not shown in FIG. 6A for clarity. FIG. 6B illustrates a cross-sectional view taken along line B-B' of FIG. 6A. The materials, configurations, structures, processes and/or arrangements utilized in elements of the semiconductor device structure 600F that are similar to those employed in the semiconductor device structures 600B, 600D and 600E shown in FIGS. 2A-2B, 4A-4B and 5A-5C are not repeated herein. One of the differences between the semiconductor device structure 600E and the semiconductor device structure 600F is that the semiconductor device structure 600F includes the dummy gate 240B and the dummy gate 242B similar to the dummy gate 240B and the dummy gate 242B of the semiconductor device structure 600B.

Figure 7A:
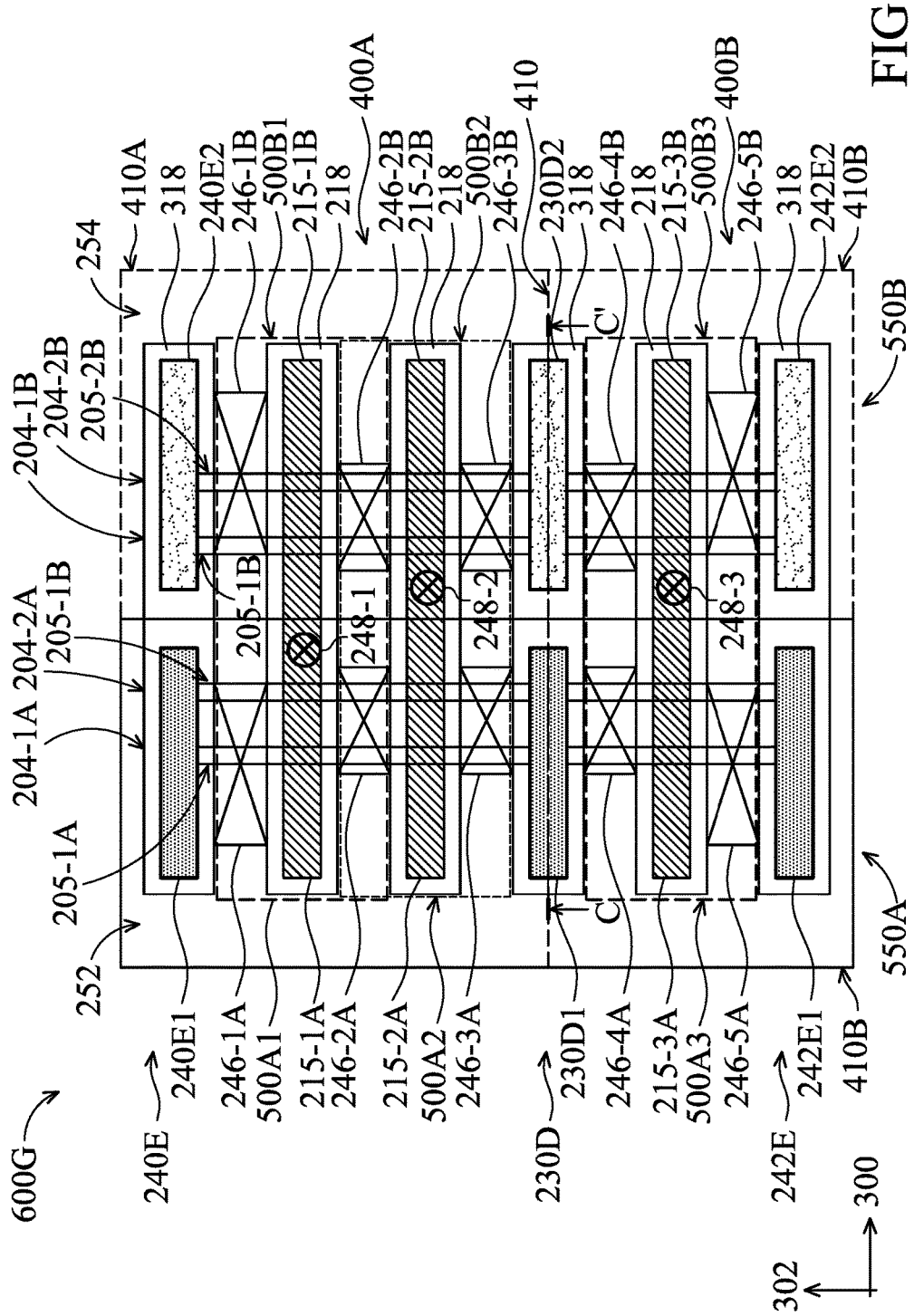
FIG. 7A is a top view of a layout of a semiconductor device structure in accordance with some embodiments.
Figure 7B:
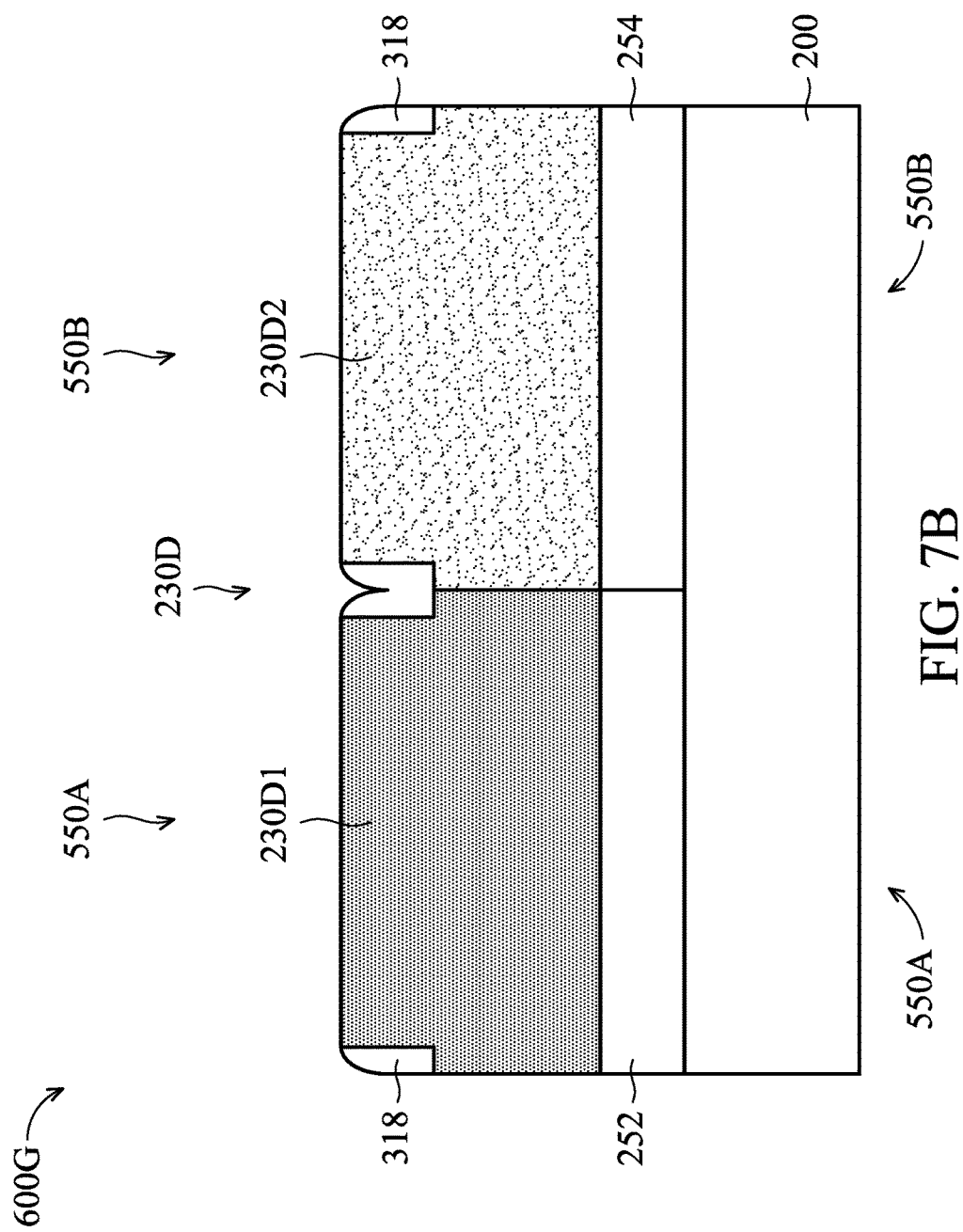
FIG. 7B illustrates a cross-sectional view taken along line C-C' of FIG. 7A, showing cross-sectional views of a semiconductor device structure in accordance with embodiments.

FIG. 7A is a top view of a layout of a semiconductor device structure 600G in accordance with some embodiments. It should be noted that some features, for example, the isolating features, the source/drain features and the dielectric layer (e.g. the inter-layer dielectric (ILD) layer 234) are not shown in FIG. 7A for clarity. FIG. 7B illustrates a cross-sectional view taken along line C-C' of FIG. 7A. The materials, configurations, structures, processes and/or arrangements utilized in elements of the semiconductor device structure 600G that are similar to those employed in the semiconductor device structure 600A shown in FIGS. 1A to 1C are not repeated herein. One of the differences between the semiconductor device structure 600A and the semiconductor device structure 600G is that the semiconductor device structure 600G includes the dummy gates 230D, 240E and 242E arranged along the direction 300 and extending substantially along the direction 302. The positions of the dummy gates 230D, 240E and 242E may be respectively similar to the dummy gates 230A, 240A and 242A.

As shown in FIGS. 7A-7B, each of the dummy gates 230D, 240E and 242E may include a first portion in the first device region 550A and a second portion in the second device region 550B. In some embodiments, the materials, configurations, structures of first portions and second portions of the dummy gates 230D, 240E and 242E are the same as or similar to those of the first portions 230A1, 240A1 and 242A1 and the second portions 230A2, 240A2 and 242A2 of the dummy gates 230A, 240A and 242A. In some embodiments, a first portion 230D1 and a second portion 230D2 of the dummy gate 230D are separated from each other and surrounded by a spacer 318. Similarly, the first portions 240E1 (or 242E1) and second portions 240E2 (or 242E2) of the dummy gates 240E (or 242E) are separated from each other and surrounded by the corresponding spacers 318. In some embodiments, the materials, configurations, structures of the spacers 318 are the same as or similar to those of the spacers 218.

Figure 8:
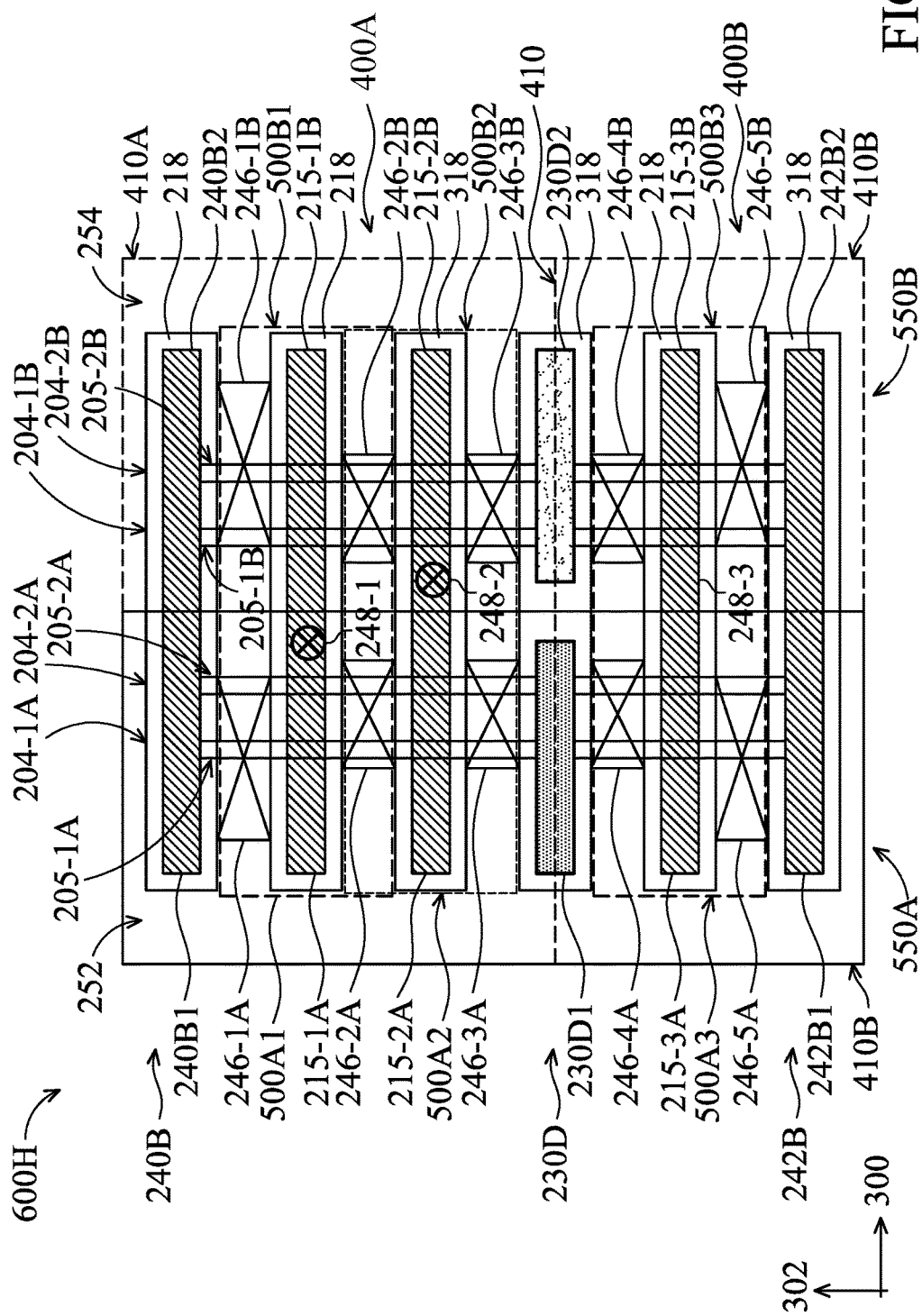
FIG. 8 is a top view of a layout of a semiconductor device structure in accordance with some embodiments.

FIG. 8 is a top view of a layout of a semiconductor device structure 600H in accordance with some embodiments. It should be noted that some features, for example, the source/drain features and the dielectric layer (e.g. the inter-layer dielectric (ILD) layer) are not shown in FIG. 8 for clarity. The materials, configurations, structures, processes and/or arrangements utilized in elements of the semiconductor device structure 600H that are similar to those employed in the semiconductor device structures 600B and 600G shown in FIGS. 2A-2B and 7A-7B are not repeated herein. One of the differences between the semiconductor device structure 600H and the semiconductor device structure 600G is that the semiconductor device structure 600H includes the dummy gate 240B and the dummy gate 242B similar to the dummy gate 240B and the dummy gate 242B of the semiconductor device structure 600B.

Embodiments of a semiconductor device structure are provided. The semiconductor device structure composed by N-type and P-type fin field effect transistors (FinFETs) includes a dielectric dummy gate arranged along a common boundary portion shared by two adjacent circuit regions. The dielectric dummy gate may be composed by a first portion in a P-type FinFET region and a second portion in an N-type FinFET region. In some embodiments, the first portion formed of a first strain material and the second portion of a second strain material with different stress types. As a result, capacitances and gate dielectric breakdown risks are reduced, thereby improving one or more of reliability, performance, circuit-speed and power consumption of the semiconductor device structure composed by the N-type FinFETs and the P-type FinFETs.

As described previously, embodiments of a semiconductor device structure (e.g. the semiconductor device structures 600A-600H) are provided. The semiconductor device structure includes a first circuit 400A, a second circuit 400B and a dielectric dummy gate (e.g. the dummy gates 230A, 230B, 230C and 230D). The first circuit is positioned over a substrate 200. The first circuit includes a first N-type fin field-effect transistor (FinFET) (e.g. the FinFETs 500A1 and 500A2) and a first P-type fin field-effect transistor (FinFET) (e.g. the FinFETs 500B1 and 500B2) beside the first N-type FinFET. The second circuit is adjacent to the first circuit and over the substrate. The second circuit includes a second N-type fin field-effect transistor (FinFET) (e.g. the FinFET 500A3) and a second P-type fin field-effect transistor (FinFET) (e.g. the FinFET 500B3) beside the second N-type FinFET. The dielectric dummy gate is positioned on a common boundary portion 410 shared by the first circuit and the second circuit. The dielectric dummy gate includes a first portion (e.g. the first portions 230A1, 230B1, 230C1 and 230D1) and a second portion (e.g. the second portions 230A2, 230B2, 230C2 and 230D2). The first portion is positioned between the first N-type FinFET and the second N-type FinFET and formed of a first strain material. The second portion is positioned between the first P-type FinFET and the second P-type FinFET and formed of a second strain material. Therefore, the parasitic capacitance between the source/drain contact and the dielectric dummy gate is eliminated. The circuit speed and power consumption of the semiconductor device structure is improved. In addition, the dielectric dummy gate formed by two strain materials with different stress types. The leakage between the FinFETs in the adjacent circuits is eliminated. Furthermore, the arrangement of the dielectric dummy gate may improve the circuit density.

Embodiments of a semiconductor device structure are provided. The semiconductor device structure includes a first circuit, a second circuit and a dielectric dummy gate over a substrate. The first circuit includes a first N-type fin field-effect transistor (FinFET) and a first P-type fin field-effect transistor (FinFET). The second circuit includes a second N-type fin field-effect transistor (FinFET) and a second P-type fin field-effect transistor (FinFET). The dielectric dummy gate is positioned on a common boundary portion shared by the first circuit and the second circuit. The dielectric dummy gate includes a first portion and a second portion. The first portion is positioned between the first N-type FinFET and the second N-type FinFET and formed of a first strain material. The second portion is positioned between the first P-type FinFET and the second P-type FinFET and formed of a second strain material. The parasitic capacitance between the source/drain contact and the dielectric dummy gate and the leakage between the FinFETs in the adjacent circuits are eliminated.

In some embodiments, a semiconductor device structure is provided. The semiconductor device structure includes a first circuit, a second circuit and a dielectric dummy gate. The first circuit is positioned over a substrate. The first circuit includes a first N-type fin field-effect transistor (FinFET) and a first P-type fin field-effect transistor (FinFET) beside the first N-type FinFET. The second circuit is adjacent to the first circuit and over the substrate. The second circuit includes a second N-type fin field-effect transistor (FinFET) and a second P-type fin field-effect transistor (FinFET) beside the second N-type FinFET. The dielectric dummy gate is positioned on a common boundary portion shared by the first circuit and the second circuit. The dielectric dummy gate includes a first portion and a second portion. The first portion is positioned between the first N-type FinFET and the second N-type FinFET and formed of a first strain material. The second portion is positioned between the first P-type FinFET and the second P-type FinFET and formed of a second strain material.

In some embodiments, a semiconductor device structure is provided. The semiconductor device structure includes a first circuit, a second circuit and a dielectric dummy gate. The first circuit is positioned over a substrate. The first circuit includes a first N-type fin field-effect transistor (FinFET) and a first P-type fin field-effect transistor (FinFET) beside the first N-type FinFET. The second circuit is adjacent to the first circuit and over the substrate. The second circuit includes a second N-type fin field-effect transistor (FinFET) and a second P-type fin field-effect transistor (FinFET) beside the second N-type FinFET. The dielectric dummy gate is positioned on a common boundary portion shared by the first circuit and the second circuit. The dielectric dummy gate includes a first portion, a second portion and dopants. The first portion is positioned between the first N-type FinFET and the second N-type FinFET and formed of a strain material. The second portion is positioned between the first P-type FinFET and the second P-type FinFET and formed of the strain material. The dopants are distributed in one of the first portion and the second portion.

In some embodiments, a semiconductor device structure is provided. The semiconductor device structure includes a first circuit, a second circuit and a dielectric dummy gate. The first circuit is positioned over a substrate. The first circuit includes a first N-type fin field-effect transistor (FinFET) and a first P-type fin field-effect transistor (FinFET) beside the first N-type FinFET. The second circuit is adjacent to the first circuit and over the substrate. The second circuit includes a second N-type fin field-effect transistor (FinFET) and a second P-type fin field-effect transistor (FinFET) beside the second N-type FinFET. The dielectric dummy gate is positioned on a common boundary portion shared by the first circuit and the second circuit. The dielectric dummy gate includes a first portion and a second portion. The first portion is positioned between the first N-type FinFET and the second N-type FinFET. The second portion is positioned between the first P-type FinFET and the second P-type FinFET. The first portion and the second portion of the dielectric dummy gate are separated from each other and surrounded by a spacer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
a first circuit over a substrate, wherein the first circuit comprises:
a first N-type fin field-effect transistor (FinFET); and
a first P-type fin field-effect transistor (FinFET) beside the first N-type FinFET;
a second circuit adjacent to the first circuit and over the substrate, wherein the second circuit comprises:
a second N-type fin field-effect transistor (FinFET); and
a second P-type fin field-effect transistor (FinFET) beside the second N-type FinFET;
a dielectric dummy gate on a common boundary portion shared by the first circuit and the second circuit, wherein the dielectric dummy gate comprises:
a first portion positioned between the first N-type FinFET and the second N-type FinFET and formed of a first strain material; and
a second portion positioned between the first P-type FinFET and the second P-type FinFET and formed of a second strain material.

2. The semiconductor device structure as claimed in claim 1, wherein the first portion of the dielectric dummy gate is formed of tensile strain dielectric materials, and the second portion of the dielectric dummy gate is formed of compressive strain dielectric materials.

3. The semiconductor device structure as claimed in claim 1, wherein the first portion and the second portion of the dielectric dummy gate are separated from each other and surrounded by a spacer.

4. The semiconductor device structure as claimed in claim 1, further comprising:

a first semiconductor fin and a second semiconductor fin extending along a first direction and arranged along a second direction, wherein a first metal gate electrode structure of the first N-type FinFET and a second metal gate electrode structure of the second N-type FinFET are positioned overlying the first semiconductor fin, wherein a third metal gate electrode structure of the first P-type FinFET and a fourth metal gate electrode structure of the second P-type FinFET are positioned overlying the second semiconductor fin.

5. The semiconductor device structure as claimed in claim 4, wherein the first metal gate electrode structure of the first N-type FinFET and the second metal gate electrode structure of the second N-type FinFET are formed of a first metal compound, wherein the third metal gate electrode structure of the first P-type FinFET and the fourth metal gate electrode structure of the second P-type FinFET are formed of a second metal compound that is different from the first metal compound.

6. The semiconductor device structure as claimed in claim 4, wherein the dielectric dummy gate crosses the first semiconductor fin and the second semiconductor fin along the second direction and extends into the first semiconductor fin and the second semiconductor fin.

7. The semiconductor device structure as claimed in claim 4, wherein the first N-type FinFET comprises:
first source/drain features in the first fin and on opposite sides of the first metal gate electrode structure in the first circuit,
wherein the second N-type FinFET comprises:
second source/drain features in the first fin and on opposite sides of the second metal gate electrode structure in the second circuit, wherein
one of the first source/drain features is between the first metal gate electrode structure and the dielectric dummy gate, and
one of the second source/drain features is between the second metal gate electrode structure and the dielectric dummy gate.

8. The semiconductor device structure as claimed in claim 4, further comprising:
first dummy gates overlapping ends of the first semiconductor fin and on opposite sides of the first portion of the dielectric dummy gate, wherein the first dummy gates are formed of a first material; and
second dummy gates overlapping ends of the second semiconductor fin and on opposite sides of the second portion of the dielectric dummy gate, wherein the second dummy gates are formed of a second material.

9. The semiconductor device structure as claimed in claim 8, wherein the first material is formed of tensile strain dielectric materials, and the second material is formed of compressive strain dielectric materials.

10. The semiconductor device structure as claimed in claim 8, wherein one of the first dummy gates and the one of the second dummy gates corresponding to the one of the first dummy gates are separated from each other and surrounded by a spacer.

11. A semiconductor device structure, comprising:
a first circuit over a substrate, wherein the first circuit comprises:
a first N-type fin field-effect transistor (FinFET); and
a first P-type fin field-effect transistor (FinFET) beside the first N-type FinFET;
a second circuit adjacent to the first circuit and over the substrate, wherein the second circuit comprises:
a second N-type fin field-effect transistor (FinFET); and
a second P-type fin field-effect transistor (FinFET) beside the second N-type FinFET;
a dielectric dummy gate on a common boundary portion shared by the first circuit and the second circuit, wherein the dielectric dummy gate comprises:
a first portion positioned between the first N-type FinFET and the second N-type FinFET; and
a second portion positioned between the first P-type FinFET and the second P-type FinFET, wherein the first portion and the second portion of the dielectric dummy gate are separated from each other and surrounded by a spacer.

12. The semiconductor device structure as claimed in claim 11, wherein the first portion of the dielectric dummy gate is formed of a tensile strain dielectric material, and the second portion of the dielectric dummy gate is formed of a compressive strain dielectric material.

13. The semiconductor device structure as claimed in claim 11, wherein the first portion and the second portion of the dielectric dummy gate are formed of one of the tensile strain dielectric material and the compressive strain dielectric material, and either the first portion or the second portion of the dielectric dummy gate comprises dopants distributed therein.

14. A semiconductor device structure, comprising:
a first N-type fin field-effect transistor (FinFET), wherein the first N-type FinFET comprises a first portion of a first semiconductor fin on a substrate;
a first P-type fin field-effect transistor (FinFET) beside the first N-type FinFET, wherein the first P-type FinFET comprises a first portion of a second semiconductor fin on the substrate;
a second N-type fin field-effect transistor (FinFET), wherein the second N-type FinFET comprises a second portion of the first semiconductor fin;
a second P-type fin field-effect transistor (FinFET) beside the second N-type FinFET, wherein the second P-type FinFET comprises a second portion of the second semiconductor fin;
a first dielectric dummy gate structure between the first N-type FinFET and the second N-type FinFET, wherein a portion of the first dielectric dummy gate structure is in the first semiconductor fin; and
a second dielectric dummy gate structure between the first P-type FinFET and the second P-type FinFET, wherein a portion of the second dielectric dummy gate structure is in the second semiconductor fin, and wherein the first dielectric dummy gate structure and the second dielectric dummy gate structure are surrounded by a spacer, and a portion of the spacer is between the first dielectric dummy gate structure and the second dielectric dummy gate structure.

15. The semiconductor device structure as claimed in claim 14, wherein the first dielectric dummy gate structure is formed of a tensile strain dielectric material.

16. The semiconductor device structure as claimed in claim 14, wherein the second dielectric dummy gate structure is formed of a compressive strain dielectric material.

* * * * *